US009614141B2

(12) United States Patent
Shimizu et al.

(10) Patent No.: US 9,614,141 B2
(45) Date of Patent: Apr. 4, 2017

(54) PIEZOELECTRIC CERAMIC, PIEZOELECTRIC ELEMENT, PIEZOELECTRIC DEVICE AND PIEZOELECTRIC CERAMIC MANUFACTURING METHOD

(71) Applicant: CANON KABUSHIKI KAISHA, Tokyo (JP)

(72) Inventors: Yasushi Shimizu, Fujisawa (JP); Tatsuo Furuta, Machida (JP); Shinya Koyama, Tokyo (JP); Hidenori Tanaka, Yokohama (JP); Kanako Oshima, Tokyo (JP); Makoto Kubota, Yokohama (JP); Jumpei Hayashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/989,958

(22) Filed: Jan. 7, 2016

(65) Prior Publication Data

US 2016/0204336 A1  Jul. 14, 2016

(30) Foreign Application Priority Data

Jan. 9, 2015 (JP) .................................. 2015-003198

(51) Int. Cl.
*H01L 41/187* (2006.01)
*C04B 35/00* (2006.01)
(Continued)

(52) U.S. Cl.
CPC ...... *H01L 41/1871* (2013.01); *B41J 2/14201* (2013.01); *B41J 2/14233* (2013.01);
(Continued)

(58) Field of Classification Search
CPC ... H01L 41/18; H01L 41/187; H01L 41/1871; H01B 3/12; C04B 35/418; C04B 35/4182; C04B 35/4686
(Continued)

(56) References Cited

U.S. PATENT DOCUMENTS 7,944,126 B2   5/2011  Tanaka et al.
8,182,713 B2   5/2012  Xiaobing et al.
(Continued)

FOREIGN PATENT DOCUMENTS

JP   5217997 B2   6/2013
JP   5344456 B2   11/2013

OTHER PUBLICATIONS

Suzuki et al., U.S. Appl. No. 14/961,382, filed Dec. 7, 2015.
(Continued)

*Primary Examiner* — Thomas Dougherty
(74) *Attorney, Agent, or Firm* — Fitzpatrick, Cella, Harper & Scinto

(57) ABSTRACT

A piezoelectric ceramic compatibly represents both an excellent piezoelectric constant and an excellent mechanical quality factor. The piezoelectric ceramic contains a metal oxide expressed by general formula (1) shown below and Mn by not less than 0.04 weight parts and not more than 0.36 weight parts relative to 100 weight parts of the metal oxide in terms of metal. The piezoelectric ceramic includes a plurality of first crystal grains having a perovskite structure and a plurality of second crystal grains existing at grain boundaries between the first crystal grains. The second crystal grains contain at least a metal oxide expressed by general formula (2) shown below:

$$(Ba_{1-x}Ca_x)_a(Ti_{1-y}Zr_y)O_3 \qquad (1)$$

where $0.09 \leq x \leq 0.30$, $0.025 \leq y \leq 0.085$ and $0.986 \leq a \leq 1.020$;

$$(Ba_{1-v}Ca_v)_b(Ti_{1-w}Zr_w)_cO_d \qquad (2)$$

(Continued)

where $0 \leq v \leq 1$, $0 \leq w \leq 1$, $1 \leq b \leq 6$, $2 \leq c \leq 19$, $b+2c-1 \leq d \leq b+2c$ and $b < c$ where b, c and d are integers.

28 Claims, 11 Drawing Sheets

(51) Int. Cl.

| | | |
|---|---|---|
| H02N 2/00 | (2006.01) | |
| H01L 41/09 | (2006.01) | |
| H01L 41/08 | (2006.01) | |
| H01L 41/047 | (2006.01) | |
| H01L 41/083 | (2006.01) | |
| B41J 2/14 | (2006.01) | |
| H01L 41/04 | (2006.01) | |
| H04N 5/217 | (2011.01) | |
| G02B 27/00 | (2006.01) | |

(52) U.S. Cl.
CPC ...... *B41J 2/14274* (2013.01); *G02B 27/0006* (2013.01); *H01L 41/042* (2013.01); *H01L 41/0471* (2013.01); *H01L 41/0477* (2013.01); *H01L 41/08* (2013.01); *H01L 41/083* (2013.01); *H01L 41/09* (2013.01); *H02N 2/001* (2013.01); *H04N 5/2171* (2013.01); *B41J 2202/03* (2013.01)

(58) Field of Classification Search
USPC ....... 310/358; 252/62.9 R, 62.9 PZ; 501/134
See application file for complete search history.

(56) References Cited

U.S. PATENT DOCUMENTS

| | | | |
|---|---|---|---|
| 9,231,188 B2 | 1/2016 | Suzuki et al. | |
| 9,252,685 B2 | 2/2016 | Ifuku et al. | |
| 2015/0028249 A1 | 1/2015 | Shimada et al. | |
| 2016/0204335 A1* | 7/2016 | Oshima | H01L 41/1871 347/68 |
| 2016/0204336 A1* | 7/2016 | Shimizu | H01L 41/1871 347/68 |

OTHER PUBLICATIONS

Saburo Nagakura et al. (ed.), Iwanami Dictionary of Physics and Chemistry, 5th Edition, p. 1268-1269 (Iwanami Shoten, Publishers; Feb. 20, 1998).

\* cited by examiner

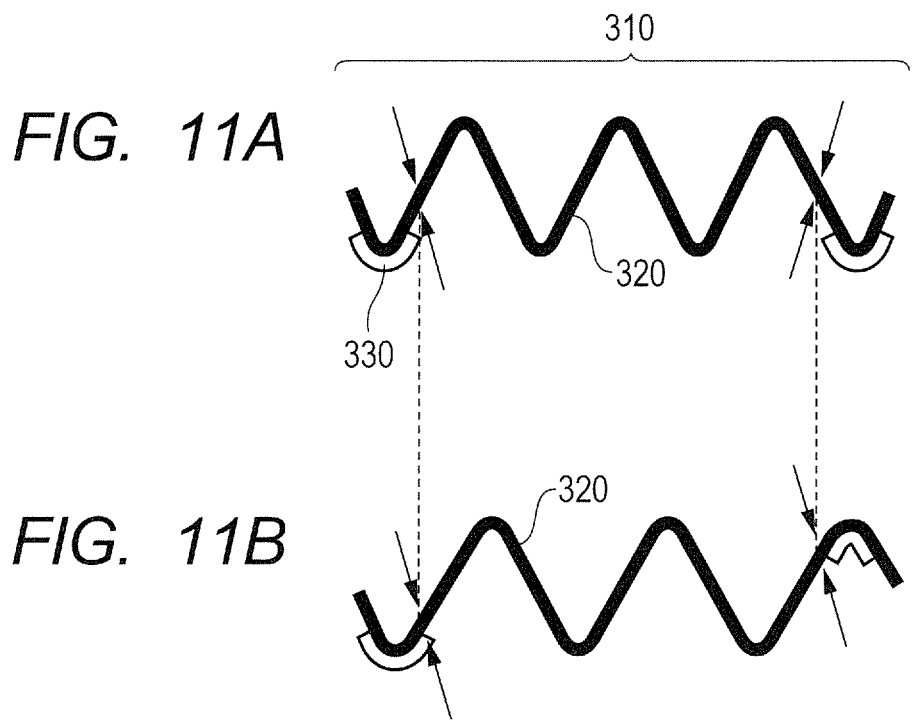
FIG. 11A
FIG. 11B
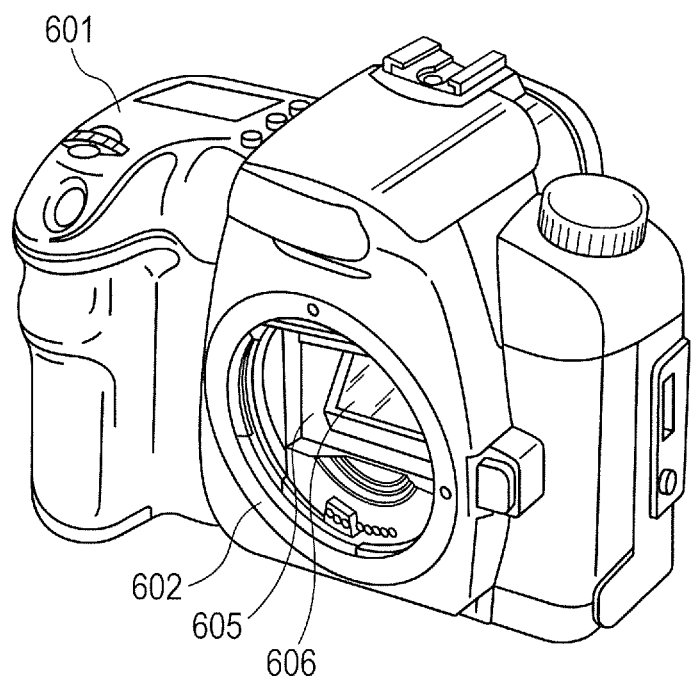
FIG. 12

PIEZOELECTRIC CERAMIC, PIEZOELECTRIC ELEMENT, PIEZOELECTRIC DEVICE AND PIEZOELECTRIC CERAMIC MANUFACTURING METHOD

BACKGROUND OF THE INVENTION

Field of the Invention

The present invention relates to a piezoelectric ceramic containing neither lead nor alkali metals. More particularly, the present invention relates to a piezoelectric ceramic compatibly representing both an excellent piezoelectric constant and an excellent mechanical quality factor at low temperatures. The present invention also relates to a piezoelectric element, a laminated piezoelectric element, a liquid ejection head, a liquid ejection device, an ultrasonic motor, an optical instrument, a vibration device, a dust removal device, an image pickup device, an electronic instrument and a piezoelectric device realized by using such a piezoelectric ceramic as well as to a piezoelectric ceramic manufacturing method.

Description of the Related Art

Perovskite type oxides having a composition expressed by $ABO_3$ such as lead zirconate titanate (to be referred to as "PZT" hereinafter) are popularly known materials of piezoelectric ceramics. However, since PZT contains lead as site A element, apprehensions have been expressed for its adverse effects on the environment of this planet. For this reason, there have been proposed piezoelectric ceramics realized by using a perovskite type oxide that does not contain lead.

Barium titanate is known as a piezoelectric ceramic including a perovskite type oxide that does not contain lead. Japanese Patent No. 5,344,456 discloses a piezoelectric ceramic obtained by partly replacing the barium atoms at the sites thereof in molecules of barium titanate by calcium atoms and also partly replacing the titanium atoms at the sites thereof by zirconium atoms in order to improve the piezoelectric characteristics of barium titanate at and near the room temperature. However, a piezoelectric ceramic disclosed in Japanese Patent No. 5,344,456 represents a low mechanical quality factor and is poorly durable at high temperatures and hence it is not suited to be used in resonance devices.

Japanese Patent No. 5,217,997 discloses a piezoelectric ceramic obtained by partly replacing the barium atoms at the sites thereof in molecules of barium titanate by calcium atoms and adding manganese, iron or copper. Japanese Patent NO. 5,217,997 describes that the ceramic has an excellent mechanical quality factor at and near the room temperature. However, the mechanical quality factor of the piezoelectric ceramic disclosed in Japanese Patent No. 5,217,997 falls at low temperatures (not higher than 0° C.) and hence the piezoelectric ceramic is not suited to be used in resonance devices.

The present invention has been made to overcome the above-identified problems of the prior art. This invention provides a piezoelectric ceramic compatibly representing both an excellent piezoelectric constant and an excellent mechanical quality factor particularly at low temperatures by controlling the composition of crystal grain boundaries and also the crystal structure thereof.

The present invention also provides a piezoelectric element, a laminated piezoelectric element, a liquid ejection head, a liquid ejection device, an ultrasonic motor, an optical instrument, a vibration device, a dust removal device, an image pickup device, an electronic instrument and a piezoelectric device realized by using such a piezoelectric ceramic along with a piezoelectric ceramic manufacturing method.

SUMMARY OF THE INVENTION

In a first aspect of the present invention, there is provided a piezoelectric ceramic containing a metal oxide expressed by general formula (1) shown below and Mn by not less than 0.04 weight parts and not more than 0.36 weight parts relative to 100 weight parts of the metal oxide in terms of metal; the piezoelectric ceramic including a plurality of first crystal grains having a perovskite structure and a plurality of second crystal grains existing at grain boundaries between the first crystal grains and having a crystal structure different from that of the first crystal grains; the second crystal grains containing at least a metal oxide expressed by general formula (2) shown below as principal ingredient:

$$(Ba_{1-x}Ca_x)_a(Ti_{1-y}Zr_y)O_3 \quad (1)$$

where $0.09 \leq x \leq 0.30$, $0.025 \leq y \leq 0.085$ and $0.986 \leq a \leq 1.020$;

$$(Ba_{1-v}Ca_v)_b(Ti_{1-w}Zr_w)_cO_d \quad (2)$$

In a second aspect of the present invention, there is provided a piezoelectric ceramic containing a metal oxide expressed by general formula (3) shown below and Mn by not less than 0.04 weight parts and not more than 0.36 weight parts relative to 100 weight parts of the metal oxide in terms of metal; the piezoelectric ceramic including a plurality of first crystal grains having a perovskite structure and a plurality of second crystal grains existing at grain boundaries between the first crystal grains and having a crystal structure different from that of the first crystal grains; the second crystal grains containing at least a metal oxide expressed by general formula (4) shown below as principal ingredient:

$$(Ba_{1-x}Ca_x)_a(Ti_{1-y}Zr_y)O_3 \quad (3)$$

where $0.09 \leq x \leq 0.30$, $0.025 \leq y \leq 0.085$ and $0.986 \leq a \leq 1.020$;

$$(Ba_{1-m}Ca_m)_e(Ti_{1-n}Zr_n)_fO_g \quad (4)$$

where $0 \leq m \leq 1$, $0 \leq n \leq 1$, $2 \leq e \leq 5$, $1 \leq f \leq 3$, $g=e+2f$ and $e<f$ where e, f and g are integers.

According to the present invention, there is also provided a piezoelectric element including at least a piezoelectric ceramic section and first and second electrodes for applying a voltage to the piezoelectric ceramic section, the piezoelectric ceramic section being formed by using a piezoelectric ceramic according to the present invention.

According to the present invention, there is also provided a laminated piezoelectric element including a plurality of piezoelectric ceramic layers and a plurality of electrode layers alternately laid one on the other, the plurality of piezoelectric ceramic layers being formed by using piezoelectric ceramics according to the present invention.

According to the present invention, there is also provided a liquid ejection head including at least a liquid chamber having a vibrating section provided with a piezoelectric element or a laminated piezoelectric element according to the present invention and an ejection port communicating with the liquid chamber.

According to the present invention, there is also provided a liquid ejection device including a mounting section for supporting a transfer medium and a liquid ejection head according to the present invention, the liquid ejection device being so configured as to cause liquid ejected from the liquid ejection head to adhere to the transfer medium supported on the mounting section.

According to the present invention, there is also provided a ultrasonic motor including at least a vibrator provided with a piezoelectric element or a laminated piezoelectric element according to the present invention and a mobile body held in contact with the vibrator, the mobile body being so arranged as to be driven by the vibrations of the vibrator.

According to the present invention, there is also provided an optical instrument including a drive section having an ultrasonic motor according to the present invention.

According to the present invention there is also provided a vibration device including a vibrating plate provided with a piezoelectric element or a laminated piezoelectric element according to the present invention.

According to the present invention, there is also provided a dust removal device including a vibrating section having a vibration device according to the present invention.

According to the present invention, there is also provided an image pickup device including at least an image pickup element unit and a dust removal device according to the present invention, the vibrating plate of the dust removal device being arranged at the light receiving surface side of the image pickup unit.

According to the present invention, there is also provided an electronic instrument including a piezoelectric acoustic unit provided with a piezoelectric element or a laminated piezoelectric element according to the present invention.

According to the present invention, there is also provided a piezoelectric device including: a piezoelectric element or a laminated piezoelectric element according to the present invention; and at least either a voltage application unit for applying a voltage to the piezoelectric element or the laminated piezoelectric element, or a power take-out unit for taking out power from the piezoelectric element or the laminated piezoelectric element.

According to the present invention, there is also provided a piezoelectric ceramic manufacturing method including: a step of obtaining a powdery mixture by mixing a first powder of a metal oxide containing Ba, Ca, Ti and Zr and having a perovskite structure and a second powder of a metal oxide containing Ba and Ti and having a crystal structure different from the first powder to a mixing ratio of not less than 95 mass % and not more than 99.9 mass % for the part of the first powder; a granulating step; a molding step; and a sintering step conducted at a temperature not higher than a highest temperature of 1,380° C., the steps being executed in the above-listed order.

Further features of the present invention will become apparent from the following description of exemplary embodiments with reference to the attached drawings.

BRIEF DESCRIPTION OF THE DRAWINGS

FIGS. 11A and 11B are schematic illustrations of the vibration principle of a dust removal device according to the present invention.

FIG. 12 is a schematic illustration of an embodiment of image pickup device according to the present invention.

DESCRIPTION OF THE EMBODIMENTS

Figure 1:
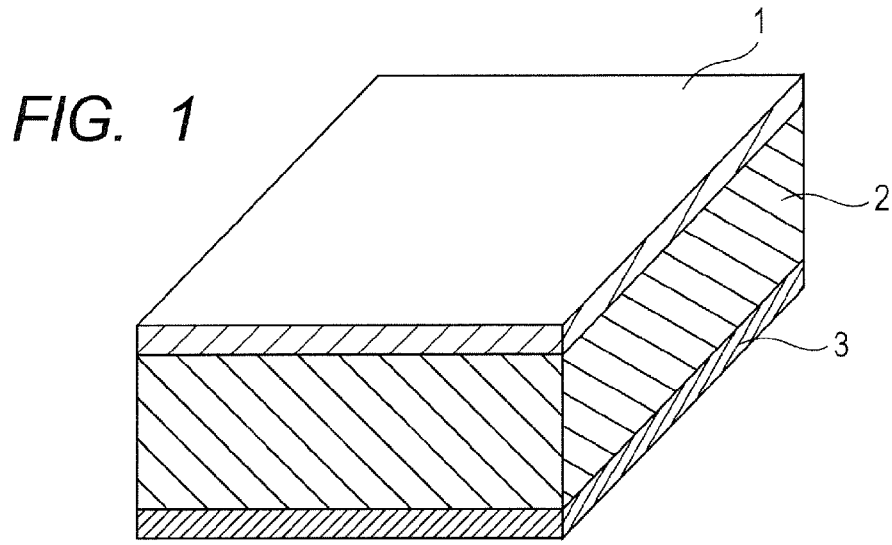
FIG. 1 is a schematic illustration of a piezoelectric element according to the present invention, representing an exemplary configuration thereof.

Preferred embodiments of the present invention will now be described in detail in accordance with the accompanying drawings.

Now, currently preferred embodiments of the present invention will be described below.

(Piezoelectric Ceramic in First Aspect of Present Invention)

In a first aspect of the present invention, there is provided a piezoelectric ceramic containing a metal oxide expressed by general formula (1) shown below and Mn by not less than 0.04 weight parts and not more than 0.36 weight parts relative to 100 weight parts of the metal oxide in terms of metal; the piezoelectric ceramic including a plurality of first crystal grains having a perovskite structure and a plurality of second crystal grains existing at grain boundaries between the first crystal grains and having a crystal structure different from that of the first crystal grains; the second crystal grains containing at least a metal oxide expressed by general formula (2) shown below as principal ingredient:

$(Ba_{1-x}Ca_x)_a(Ti_{1-y}Zr_y)O_3$ (1)

where $0.09 \leq x \leq 0.30$, $0.025 \leq y \leq 0.085$ and $0.986 \leq a \leq 1,020$;

$(Ba_{1-v}Ca_v)_b(Ti_{1-w}Zr_w)_cO_d$ (2)

where $0 \leq v \leq 1$, $0 \leq w \leq 1$, $1 \leq b \leq 6$, $2 \leq c \leq 19$, $b+2c-1 \leq d \leq b+2c$ and $b<c$ where b, c and d are integers.

As a piezoelectric ceramic according to the present invention satisfies the above requirements, it allows an excellent piezoelectric constant and an excellent mechanical quality factor to be compatible with each other particularly at low temperatures.

In the specification of the present invention, the expression of a "ceramic" refers to an agglomerate (also referred to as a bulk body) of crystal grains, that is, a polycrystalline material whose basic component is a metal oxide that is baked and hardened by a heat treatment, that is, by sintering. A ceramic may or may not be processed after the sintering step. Note that, however, for the purpose of the present invention, this expression does not include powder as it is or slurry in which powder is dispersed.

The general formula (1) represents the average composition in a piezoelectric ceramic according to the present invention with focus on the oxide of the metals other than Mn. Microscopically, a piezoelectric ceramic according to the invention is an agglomerate of first crystal grains having a perovskite structure and second crystal grains having a non-perovskite structure and hence the metal composition ratio thereof may vary as a function of position in the ceramic.

In the general formula (1), the numerical value of x, which represents the mole ratio of Ca at site A, is within the range of $0.09 \leq x \leq 0.30$. A piezoelectric ceramic according to the present invention has a feature that the piezoelectric characteristics (including the mechanical quality factor and the piezoelectric constant) thereof change as the environmental temperature changes. If the value of x is less than 0.09, the piezoelectric characteristics change excessively depending on the environmental temperature to make it difficult to control the drive frequency and the drive voltage thereof. If, on the other hand, the value of x is more than 0.30, the piezoelectric characteristics fall low and hence a high drive voltage is required when the piezoelectric ceramic is used for a piezoelectric device. The numerical value of x is preferably $0.10 \leq x \leq 0.20$, more preferably $0.12 \leq x \leq 0.18$.

In the above general formula (1), the numerical value of y, which represents the mole ratio of Zr at site B, is $0.025 \leq y \leq 0.085$. If the value of y is greater than 0.085, the Curie temperature falls to make it change with time to a large extent so that consequently the piezoelectric characteristics fall. If, on the other hand, the value of y is smaller than 0.025, the piezoelectric constant becomes too small at the room temperature and lower temperatures. The numerical value of y is preferably $0.040 \leq y \leq 0.083$, more preferably $0.050 \leq y \leq 0.080$.

In the general formula (1), the numerical value of a, which represents the ratio of the molar quantity of Ba and Ca to the molar quantity of Ti and Zr, is within the range of $0.986 \leq a \leq 1.020$. If the value of a is smaller than 0.986, the number of first crystal grains that represent an abnormal grain growth increase to decrease the mechanical strength of the piezoelectric ceramic. If, on the other hand, the value of a is greater than 1.020, there can be instances where a piezoelectric ceramic having a sufficiently large density is not obtained because the sintering temperature is insufficient. The numerical value of a is preferably $0.990 \leq a \leq 1.000$, more preferably $0.993 \leq a \leq 0.999$.

While there are no limitations to the techniques that can be used to identify the numerical values of x, y and a for a piezoelectric ceramic according to the present invention, the use of means for melting and analyzing the entire piezoelectric ceramic such as ICP (inductively coupled plasma) atomic emission spectrophotometry is preferable since they constitute the average composition in the entire piezoelectric ceramic.

A piezoelectric ceramic according to the present invention contains a metal oxide expressed by the general formula (1) and Mn by not less than 0.04 weight parts and not more than 0.36 weight parts relative to 100 weight parts of the metal oxide in terms of metal.

To identify the Mn (manganese) content in a piezoelectric ceramic according to the invention relative to the content of the metal oxide, the content of each of the metals is firstly computationally determined in an operation of observing the piezoelectric ceramic by means of X-ray fluorescence spectrometry (XRF), ICP atomic emission spectrophotometry, atomic absorption spectrometry, SEM-EDX (scanning electron microscope-energy dispersive X-ray spectroscopy), STEM-EDX (scanning transmission electron microscope-energy dispersive X-ray spectroscopy) or the like. Then, the weight of each of the elements constituting the metal oxide expressed by the general formula (1) is determined in terms of metal oxide on the basis of the content of the metal and the weight part of Mn relative to the total weight, which is expressed by 100, is determined. ICP atomic emission spectrophotometry is a suitable analysis means to find out the content of Mn contained in the entire piezoelectric ceramic. SEM-EDX or STEM-EDX may suitably be employed for the purpose of finding out the locations where Mn exists in the ceramic or the content gradation of Mn in the ceramic.

As a piezoelectric ceramic according to the present invention contains Mn within the above-defined range, it represents an improved mechanical quality factor (Qm) at the room temperature and in a cold temperature range under the room temperature as a result of the synergetic effect of the Mn content and the content of the second crystal grains. The mechanical quality factor is a factor that indicates the loss of elasticity due to vibrations when the piezoelectric ceramic is evaluated as vibrator. The value of the mechanical quality factor is observed as the sharpness of the resonance curve that is observed when measuring the impedance of the ceramic. When a piezoelectric ceramic represents an improved mechanical quality factor and the ceramic is driven to operate as piezoelectric element by applying a voltage thereto, long term reliability can be secured for the piezoelectric element.

When the Mn content of a piezoelectric ceramic is less than 0.04 weight parts, the piezoelectric constant (e.g., $d_{31}$) and the mechanical quality factor fall remarkably as a function of elapsed time to make the ceramic not durable for long time operations. When, on the other hand, the Mn content of a piezoelectric ceramic exceeds 0.36 weight parts, there arises a problem of high power consumption rate at the time of driving the piezoelectric ceramic because of a rise of the dielectric loss tangent. Such a piezoelectric ceramic is no longer good for use.

Mn in a piezoelectric ceramic according to the present invention is not limited to metal Mn. In other words, it is sufficient for a piezoelectric ceramic according to the present invention that it contains Mn in any form. While Mn can take valences such as 4+, 2+ and 3+, Mn becomes to operate as acceptor when its valence is lower than 4+. If Mn exists in a perovskite crystal as acceptor, oxygen vacancies are formed in the crystal. When oxygen vacancies form defective dipoles, the mechanical quality factor of the piezoelectric ceramic can be improved. For Mn to exist with a valence lower than 4+, a trivalent element preferably exists at site A. A preferable trivalent element is Bi. On the other hand, the valence of Mn can be estimated by observing the temperature dependency of the magnetic susceptibility.

A piezoelectric ceramic according to the present invention includes a plurality of first crystal grains having a perovskite structure and a plurality of second crystal grains existing at grain boundaries between the first crystal grains and having a crystal structure different from that of the first crystal grains.

For the purpose of the present invention, crystal grains having a perovskite structure refer to grains of a metal oxide having a perovskite structure, which is ideally a cubic crystal structure, as described in Iwanami's Dictionary of Physics and Chemistry, 5th ed. (published on Feb. 20, 1998). As far as the present invention is concerned, the perovskite structure does not include a layered perovskite structure. A metal oxide having a perovskite structure is generally expressed by a chemical formula of $ABO_3$. In a metal oxide having a perovskite structure, element A and element B occupy respective specific positions in each unit lattice that are called respectively as site A and site B. In the case of a unit lattice of a cubic crystal system, element A is located at the vertex of the cube and element B is located at the center of the cube. Element O occupies the face-centered position of the cube as oxygen negative ion. As each of element A, element B and element O is slightly shifted from its target position in the coordinate system of the unit lattice, the unit lattice of the perovskite structure is distorted to turn into some other crystal system such as a tetragonal crystal system, a rhombohedral crystal system or an orthorhombic crystal system. Since the first crystal grains of a piezoelectric ceramic according to the present invention as defined above constitute part of the metal oxide expressed by the general formula (1), element A includes Ba and Ca and element B include Ti and Zr.

In the specification of the present invention, the expression of "crystal grains" is intended to refer to grains that form polycrystals as described under item "polycrystal" in Iwanami's Dictionary of Physics and Chemistry, 5th ed. (published on Feb. 20, 1998). As far as the present invention is concerned, crystal grains exclude grains that represent inter-granular mobility.

In the specification of the present invention, the expression of "grain boundaries" refers to interfaces of crystal grains (including linear interfaces and spot interfaces). When first crystal grains contact each other, their contacting surfaces are referred to as grain boundaries. When first crystal grains contact each other by way of one or more than one smaller second crystal grains, proximate spaces of first grains are referred to as grain boundaries. Of "grain boundaries", a proximate space that is formed by three crystal grains may also be referred to as "a triple point".

Second crystal grains have a crystal structure that is different from the crystal structure of first crystal grains. Having a different crystal structure means that the crystal structure of second crystal grains is not a perovskite structure.

The second crystal grains that are contained in a piezoelectric ceramic according to the present invention contain as principal ingredient thereof a metal oxide expressed by the above-described general formula (2). In the general formula (2), the relations among v representing the mole ratio of Ca at site A, w representing the mole ratio of Zr at site B, b and c respectively representing the ratio of the molar quantities of Ba and Ca at site A and the ratio of the molar quantities of Ti and Zr at site B and d representing the quantity of oxygen are expressed by $0 \leq v \leq 1$, $0 \leq w \leq 1$, $1 \leq b \leq 6$, $2 \leq c \leq 19$, $b+2c-1 \leq d \leq b+2c$ and $b<c$, where b, c and d are selected from positive integers. The constituent metals of the metal oxide expressed by the general formula (2) are the same as those of the metal oxide expressed by the general formula (1) and hence a piezoelectric ceramic according to the present invention is free from intrusions of foreign elements so that the piezoelectric characteristics of the first crystal grains are not damaged by foreign elements and the advantages of the present invention are secured. Additionally, since $b<c$ in the general formula (2), any possible deposition of some of the ingredients of the first crystal grains at grain boundaries can be minimized at the time of manufacturing or using the ceramic. In other words, the phenomenon, if any, where some of the ingredients of the first crystal grains move out to degrade the piezoelectric characteristics can be suppressed to a minimal level.

From the viewpoint of ease of synthesis and not damaging the piezoelectric characteristics of a piezoelectric ceramic according to the present invention, the second crystal grains are preferably at least crystal grains of a metal oxide selected from $BaTi_2O_5$, $BaTi_4O_9$, $BaTi_5O_{11}$, $BaTi_6O_{13}$, $BaTi_7O_{14}$, $BaTi_8O_{16}$, $Ba_2Ti_5O_{12}$, $Ba_2Ti_6O_{13}$, $Ba_2Ti_9O_{20}$, $Ba_4Ti_{11}O_{26}$, $Ba_4Ti_{13}O_{30}$, $CaTi_2O_4$, $CaTi_2O_5$, $CaTi_4O_9$, $Ca_2Ti_5O_{12}$, $CaZr_4O_9$, $Ca_2Zr_7O_{16}$, $Ca_6Zr_{19}O_{44}$, $CaZrTi_2O_7$ and $Ca_2Zr_5Ti_2O_{16}$.

Preferably, a piezoelectric ceramic according to the present invention as defined above contains Bi by not less than 0.042 weight parts and not more than 0.850 weight parts relative to 100 weight parts of the metal oxide in terms of metal. When it contains Bi within the above range, the piezoelectric constant and the mechanical quality factor at temperatures not higher than 0° C. are improved further.

When the Bi content falls below 0.042 weight parts, the effect of improving the mechanical quality factor also falls. When, on the other hand, the Bi content exceeds 0.850 weight parts, the piezoelectric constant can fall. More preferably, the Bi constant is not less than 0.1 weight parts and not more than 0.4 weight parts. Bi in a piezoelectric ceramic according to the present invention is not limited to metal Bi. In other words, it is sufficient for a piezoelectric ceramic according to the present invention that it contains Bi in any form. However, Bi, which is a second sub-ingredient, is preferably dissolved as solid at site A as trivalent Bi. The valence of Bi can be identified by means of, for example, a technique of X-ray absorption fine structure (XAFS) analysis using synchrotron radiation.

Preferably, a piezoelectric ceramic according to the present invention satisfies the requirement that the ratio A1/B1, where A1 is the number of moles of Ba and Ca and B1 is the number of moles of Ti and Zr of the first crystal grains that contact the second crystal grains, and the ratio A2/B2, where A2 is the number of moles of Ba and Ca and B2 is the number of moles of Ti and Zr of the first crystal grains that do not contact the second crystal grains represent the relationship of A1/B1>A2/B2. When a piezoelectric ceramic satisfies the requirement of the above relationship, the local dispersion of atomic density, if any, is alleviated to improve the insulation of the piezoelectric ceramic.

Generally, when manganese is added to a piezoelectric ceramic, all the added manganese are not necessarily found in the crystal grains (the first crystal grains in this specification of the present invention) but may partly exist at grain boundaries as manganese oxide ($MnO_x$).

Any segregation of manganese lowers the manganese concentration in the crystal grains of the piezoelectric ceramic and reduce the mechanical quality factor of the piezoelectric ceramic. Additionally, any voids in the piezoelectric ceramic induce segregation of manganese. When the segregated manganese are disposed in rows, they constitute electroconductive paths to degrade the insulation of the piezoelectric ceramic.

When second crystal grains exist at grain boundaries of first crystal grains in a piezoelectric ceramic according to the present invention, they fill some of the voids among the first crystal grains to partly block electroconductive paths of leak currents. Then, consequently, the electric insulation of the piezoelectric ceramic is improved. Additionally, since the second crystal grains of the piezoelectric ceramic that are expressed by the generating formula (2) or the general formula (4), which will be described hereinafter, are dielectrics and hence they improve the dielectric property (relative inductivity) of the piezoelectric ceramic if compared with an instance where voids are found among the first crystal grains to consequently raise the piezoelectric constant thereof. Furthermore, the second crystal grains that are contained in a piezoelectric ceramic according to the present invention suppress any possible deposition of Mn at grain boundaries to consequently raise the density of Mn that is dissolved as solid by the first crystal grains. Then, as a result, the mechanical quality factor of the piezoelectric ceramic is raised at the room temperature and lower temperatures. The effect of raising the mechanical quality factor of the present invention appears conspicuously particularly at 0° C. and lower temperatures.

(Piezoelectric Ceramic in Second Aspect of Present Invention)

In a second aspect of the present invention, there is provided a piezoelectric ceramic containing a metal oxide expressed by general formula (3) shown below and Mn by not less than 0.04 weight parts and not more than 0.36 weight parts relative to 100 weight parts of the metal oxide in terms of metal; the piezoelectric ceramic including a plurality of first crystal grains having a perovskite structure and a plurality of second crystal grains existing at grain boundaries between the first crystal grains and having a crystal structure different from that of the first crystal grains; the second crystal grains containing at least a metal oxide expressed by general formula (4) shown below as principal ingredient:

$$(Ba_{1-x}Ca_x)_a(Ti_{1-y}Zr_y)O_3 \quad (3)$$

where $0.09 \leq x \leq 0.30$, $0.025 \leq y \leq 0.085$ and $0.986 \leq a \leq 1.020$;

$$(Ba_{1-m}Ca_m)_e(Ti_{1-n}Zr_n)_fO_g \quad (4)$$

where $0 \leq m \leq 1$, $0 \leq n \leq 1$, $2 \leq e \leq 5$, $1 \leq f \leq 3$, $g = e + 2f$ and $e < f$ where e, f and g are integers.

As a piezoelectric ceramic according to the present invention satisfies the above requirements, it allows an excellent piezoelectric constant and an excellent mechanical quality factor to be compatible with each other particularly at low temperatures.

Like the general formula (1), the general formula (3) represents the average composition in a piezoelectric ceramic according to the present invention with focus on the oxide of metals other than Mn.

In the general formula (3), the numerical value of x, which represents the mole ratio of Ca at site A, is within the range of $0.09 \leq x \leq 0.30$. A piezoelectric ceramic according to the present invention has a feature that the piezoelectric characteristics (including the mechanical quality factor and the piezoelectric constant) thereof change as the environmental temperature changes. If the value of x is less than 0.09, the piezoelectric characteristics change excessively depending on the environmental temperature to make it difficult to control the drive frequency and the drive voltage thereof. If, on the other hand, the value of x is more than 0.30, the piezoelectric characteristics fall low and hence a high drive voltage is required when the piezoelectric ceramic is used for a piezoelectric device. The numerical value of x is preferably $0.10 \leq x \leq 0.20$, more preferably $0.12 \leq x \leq 0.18$.

In the above general formula (3), the numerical value of y, which represents the mole ratio of Zr at site B, is $0.025 \leq y \leq 0.085$. If the value of y is greater than 0.085, the Curie temperature falls to make its change with time to a large extent so that consequently the piezoelectric characteristics fall. If, on the other hand, the value of y is smaller than 0.025, the piezoelectric constant becomes too small at the room temperature and lower temperatures. The numerical value of y is preferably $0.040 \leq y \leq 0.083$, more preferably $0.050 \leq y \leq 0.080$.

In the general formula (3), the numerical value of a, which represents the ratio of the molar quantity of Ba and Ca to the molar quantity of Ti and Zr, is within the range of $0.986 \leq a \leq 1.020$. If the value of a is smaller than 0.986, the number of first crystal grains that represent an abnormal grain growth increase to decrease the mechanical strength of the piezoelectric ceramic. If, on the other hand, the value of a is greater 1.020, there can be instances where a piezoelectric ceramic having a sufficiently large density is not obtained because the sintering temperature is insufficient. The numerical value of a is preferably $0.990 \leq a \leq 1.000$, more preferably $0.993 \leq a \leq 0.999$.

While there are no limitations to the techniques that can be used to identify the numerical values of x, y and a for a piezoelectric ceramic according to the present invention, the use of means for melting and analyzing the entire piezoelectric ceramic such as ICP (inductively coupled plasma) atomic emission spectrophotometry is preferable since they constitute the average composition in the entire piezoelectric ceramic.

A piezoelectric ceramic according to the present invention contains a metal oxide expressed by the general formula (3) and Mn by not less than 0.04 weight parts and not more than 0.36 weight parts relative to 100 weight parts of the metal oxide in terms of metal.

A piezoelectric ceramic according to the present invention includes a plurality of first crystal grains having a perovskite structure and a plurality of second crystal grains existing at grain boundaries among the first crystal grains and having a crystal structure different from that of the first crystal grains.

Since the first crystal grains of a piezoelectric ceramic according to the present invention as defined above constitute part of the metal oxide expressed by the general formula (3), element A includes Ba and Ca and element B include Ti and Zr.

The second crystal grains that are contained in a piezoelectric ceramic according to the present invention contain as principal ingredient thereof a metal oxide expressed by the above-described general formula (4). In the general formula (4), the relations among m representing the mole ratio of Ca at site A, n representing the mole ratio of Zr at site B, e and f respectively representing the ratio of the molar quantities of Ba and Ca at site A and the ratio of the molar quantities of Ti and Zr at site B and g representing the quantity of oxygen are expressed by $0 \leq m \leq 1$, $0 \leq n \leq 1$, $2 \leq e \leq 5$, $1 \leq f \leq 3$, $g = e + 2f$ and $e > f$, where e, f and g are selected from positive integers. The second crystal grains that are expressed by the general formula (4) additionally can dissolve Mn as solid at the site of Ti or Zr so that they can suppress segregation of Mn to grain boundaries and improve the insulation of the piezoelectric ceramic.

From the viewpoint of ease of synthesis and not damaging the piezoelectric characteristics of a piezoelectric ceramic, the second crystal grains are preferably at least crystal grains of a metal oxide selected from $Ba_2TiO_4$, $Ca_2TiO_4$, $Ca_3Ti_2O_7$, $Ba_2ZrO_4$, $Ba_3Zr_2O_7$, $BaCaTiO_4$, $Ba_3Ca_2Ti_2O_9$ and $Ca_4Ti_3O_{10}$.

Preferably, a piezoelectric ceramic according to the present invention as defined above contains Bi by not less than 0.042 weight parts and not more than 0.850 weight parts relative to 100 weight parts of the metal oxide in terms of metal. When it contains Bi within the above range, the piezoelectric constant and the mechanical quality factor at temperatures not higher than 0° C. are improved further.

When the Bi content falls below 0.042 weight parts, the effect of improving the mechanical quality factor also falls. When, on the other hand, the Bi content exceeds 0.850 weight parts, the piezoelectric constant can fall. More preferably, the Bi content is not less than 0.1 weight parts and not more than 0.4 weight parts. Bi in a piezoelectric ceramic according to the present invention is not limited to metal Bi. In other words, it is sufficient for a piezoelectric ceramic according to the present invention that it contains Bi in any form. However, Bi, which is a second sub-ingredient, is preferably dissolved as solid at Site A as trivalent Bi.

Preferably, a piezoelectric ceramic according to the present invention satisfies the requirement that the ratio A3/B3, where A3 is the number of moles of Ba and Ca and B3 is the number of moles of Ti and Zr of the first crystal grains that contact the second crystal grains, and the ratio A4/B4, where A4 is the number of moles of Ba and Ca and B4 is the number of moles of Ti and Zr of the first crystal grains that do not contact the second crystal grains represent the relationship of A3/B3<A4/B4. When a piezoelectric ceramic satisfies the requirement of the above relationship, the local dispersion of atomic density, if any, is alleviated to improve the insulation of the piezoelectric ceramic.

(Crystal Structure of Piezoelectric Ceramic)

Figure 15:
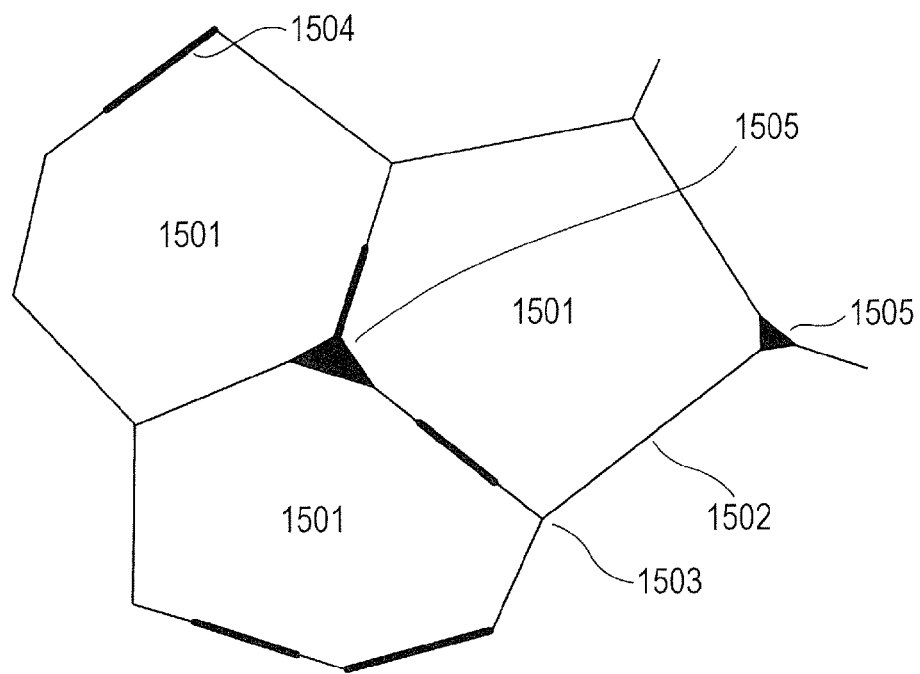
FIG. 15 is a schematic illustration of an exemplary relationship of the first crystal grains, the second crystal grains and the grain boundaries of a piezoelectric ceramic according to the present invention.

FIG. 15 is a schematic illustration of an embodiment of a piezoelectric ceramic according to the present invention. It schematically represents the relationship of the first crystal grains, the second crystal grains and the grain boundaries of the piezoelectric ceramic. In FIG. 15, numeral 1501 indicates a first crystal grain and first crystal grains contact each other with grain boundaries (including triple points) interposed among them. Numeral 1502 indicates a grain boundary among crystal grains and numeral 1503 indicates a triple point, while numeral 1504 indicates a second crystal grain. In a piezoelectric ceramic according to the present invention, second crystal grains 1504, which contain as principal ingredient a metal oxide expressed by the general formula (2) or (4), exist at part of the grain boundaries, each separating two first crystal grains, and at part of the triple points 1503.

In FIG. 15, numeral 1505 indicates a second crystal grain that is found at a triple point. According to the present invention, the principal ingredient of the second crystal grains is either a metal oxide expressed by the general formula (2) or a metal oxide expressed by the general formula (4). When a metal oxide expressed by the general formula (2) and a metal oxide expressed by the general formula (4) coexist in the same piezoelectric ceramic, the effect of suppressing deposition of barium carbonate and the effect of suppressing deposition of Mn offset each other to consequently reduce both the piezoelectric constant and the insulation of the piezoelectric ceramic and hence such coexistence is not preferable.

Techniques that can be used to discriminate first crystal grains and second crystal grain with ease include a technique of using a scanning electron microscope (SEM) and a technique of observing them through a transmission electron microscope (TEM). These techniques utilize a phenomenon that, when observing the surface of a piezoelectric ceramic by means of any of the above techniques, first crystal grains and second crystal grains (sub-grains) can be observed with different contrasts.

The compounds that constitute the first crystal grains and the second crystal grains can be identified typically by comparing the diffraction image obtained by means of selected area electron diffractometry, using a transmission electron microscope (TEM), and the data obtained from known literatures.

Selected area electron diffractometry is a technique of observing a diffraction pattern of only a specific area in an enlarged image obtained by means of a transmission electron microscope (TEM). Only the diffraction patterns produced from the above compounds can be observed by using this technique.

The composition of a crystal grain can be analyzed by means of STEM-EDX. STEM-EDX is a technique of measuring the intensity of fluorescent X-rays at an arbitrary selected area of a sample image observed through a scanning transmission electron microscope (STEM) by means of energy dispersive X-ray spectroscopy (EDX).

In a piezoelectric ceramic according to the present invention, preferably, 99 percent or more of the number of the first crystal grains that the piezoelectric ceramic includes represent a circle equivalent diameter of not greater than 25 μm. When the percent of the number of the first crystal grains representing a circle equivalent diameter of not greater than 25 μm relative to the total number of the first crystal grains is in the above range, the piezoelectric ceramic can be made to represent an excellent mechanical strength. The mechanical strength of a piezoelectric ceramic has a strongly negative correlation with the ratio of the number of crystal grains having a large circle equivalent diameter relative to the total number crystal grains. When the percent of the number of crystal grains representing a large circle equivalent diameter is less than 99% of the total number of crystal grains, the mechanical strength of the piezoelectric ceramic can fall because the ratio of the crystal grains contained in the piezoelectric ceramic having a circle equivalent diameter of greater than 25 μm relative to the total number of crystal grains increases.

A piezoelectric ceramic according to the present invention may contain needle crystals having a long side that exceeds 25 μm. If such is the case, 99 percent or more of the number of all the first crystal grains preferably represent a diameter not greater than 25 μm when reduced to a circle equivalent diameter.

The ratio of the second crystal grains relative to the piezoelectric ceramic can be determined by means of a technique that uses a scanning electron microscope or an optical microscope. When, for example, a scanning electron microscope is employed, the surface or a cross section of the piezoelectric ceramic is observed by means of an image of reflected electrons that is obtained by the scanning electron microscope. Since first crystal grains and second crystal grains are observed with different contrasts when the above-described observation technique is employed, they can be discriminated from each other and the ratio of the surface area of the observed first crystal grains relative to the surface area of the observed second crystal grains can be determined. When the surface or a cross section of a piezoelectric ceramic according to the present invention is observed, the ratio of the area that the second crystal grains occupy relative to the total area of the surface or the cross section is preferably not less than 0.05% and not more than 1.00%.

When the ratio of the second crystal grains contained in the grain boundaries on the surface or the cross section relative to the entire piezoelectric ceramic is less than 0.05% by area, there arises a fear that the advantages of the present invention in terms of improvement of mechanical quality factor, piezoelectric constant and insulation cannot be satisfactorily obtained. When, on the other hand, the ratio of the second crystal grains contained in the grain boundaries on the surface or the cross section relative to the entire piezoelectric ceramic is more than 1.00% by area, second crystal grains that do not represent any piezoelectricity are deposited excessively so that a high piezoelectric performance of the first crystal grains may not be satisfactorily achieved.

The average circle equivalent diameter of the first crystal grains that a piezoelectric ceramic according to the present invention includes is preferably not less than 500 nm and not more than 10 μm.

The expression of the average circle equivalent diameter as used herein refers to the average value of the circle equivalent diameters of a plurality of first crystal grains. When the average circle equivalent diameter of the first crystal grains is held within the above range, a piezoelectric ceramic according to the present invention can represent an excellent piezoelectric constant and an excellent mechanical strength. When the average circle equivalent diameter is less than 500 nm, the piezoelectric constant of the piezoelectric ceramic may not be satisfactory. When, on the other hand, the average circle equivalent diameter exceeds 10 μm, the mechanical strength of the piezoelectric ceramic may undesirably fall. More preferably, the average circle equivalent diameter is not less than 500 nm and not more than 4.5 μm.

The expression of "circle equivalent diameter" as used herein refers to the expression of "projected area-equivalent diameter" that is commonly used in the field of macroscopic observations. A circle equivalent diameter refers to the diameter of a true circle having an area that is equal to the projected area of a crystal grain. For the purpose of the present invention, there are no particular limitations to the techniques that can be used to measure a circle equivalent diameter. For instance, the surface area of a piezoelectric ceramic can be obtained by processing a photographic image that is picked up by means of a polarization microscope or a scanning electron microscope. An optical microscope and an electron microscope may selectively be employed because the optimum magnification for observing crystal grains varies depending on the grain diameters of the grains to be observed. The circle equivalent diameters may be obtained not from the surface of the ceramic but from the polished surface of the ceramic or a cross section of the ceramic.

For the purpose of the present invention, the average circle equivalent diameter of the second crystal grains is preferably smaller than the average circle equivalent diameter of the first crystal grains. In other words, the crystal grains may be densely filled in the ceramic to improve the insulation of the piezoelectric ceramic when the second crystal grains are relatively small and the grain diameter ratio expressed by the average circle equivalent diameter of the first crystal grain/the average equivalent circuit diameter of the second grains is not smaller than 1. The ratio of the two grain diameters is preferably not less than 2, more preferably not less than 5.

The relative density (the bulk density/theoretical density of the sintered body×100) of a piezoelectric ceramic according to the present invention is preferably not less than 93% and not more than 100%. To obtain the relative density, firstly the theoretical density is computationally determined from the lattice constant of the piezoelectric ceramic and the atomic weights of the elements that constitute the piezoelectric ceramic and then the ratio of the observed density relative to the theoretical density is determined by calculations. The lattice constant can be determined typically by means of X-ray diffractometry. The density can be measured typically by means of the Archimedian method. When the relative density falls below 93%, there can be instances where both the piezoelectric constant and the mechanical quality factor are not satisfactory and/or the mechanical strength falls undesirably.

The relative density of a piezoelectric ceramic according to the present invention is more preferably not less than 95% and not more than 100%, most preferably not less than 97% and not more than 100%.

(Piezoelectric Ceramic Manufacturing Method)

There are no particular limitations to the piezoelectric ceramic manufacturing method according to the present invention. A typical manufacturing method will be described below.

(Starting Materials of Piezoelectric Ceramic)

When manufacturing a piezoelectric ceramic, a popular technique of producing a molded body of solid powder of compounds selected from oxides, carbonates, nitrates, oxalates, acetates and so on that contain the constituent elements of the piezoelectric ceramic and sintering the molded body under atmospheric pressure can be adopted. Starting materials that can be used for manufacturing a piezoelectric ceramic according to the present invention include metal compounds selected from Ba compounds, Ca compounds, Ti compounds, Zr compounds, Mn compounds, Bi compounds and so on.

Ba compounds that can be used for the purpose of the present invention include barium oxide, barium carbonate, barium oxalate, barium acetate, barium nitrate, barium titanate, barium zirconate and so on. Of the above-listed Ba compounds, those that represent a high degree of purity (e.g., a purity of not less than 99.99%) and are commercially available are preferably selected.

Ca compounds that can be used for the purpose of the present invention include calcium oxide, calcium carbonate, calcium titanate and so on. Of the above-listed Ca compounds, those that represent a high degree of purity (e.g., a purity of not less than 99.99%) and are commercially available are preferably employed.

Ti compounds that can be used for the purpose of the present invention include titanium oxide, barium titanate and barium titanate zirconate and so on. Of the above-listed Ti compounds, those that represent a high degree of purity (e.g., a purity of not less than 99.99%) and are commercially available are preferably selected particularly when they contain alkali earth metals such as barium.

Zr compounds that can be used for the purpose of the present invention include zirconium oxide, barium zirconate and barium titanate zirconate and so on. Of the above-listed Zr compounds, those that represent a high degree of purity (e.g., a purity of not less than 99.99%) and are commercially available are preferably selected particularly when they contain alkali earth metals such as barium.

Mn compounds that can be used for the purpose of the present invention include manganese carbonate, manganese oxide, manganese dioxide, manganese acetate, trimanganese tetraoxide and so on.

Bi compounds that can be used for the purpose of the present invention include bismuth oxide and so on.

There are no particular limitations to the material to be used to adjust the value of a that represents the ratio of the molar quantity of Ba and Ca at site A to the molar quantity of Ti and Zr at site B. Substantially the same effect can be obtained regardless if a Ba compound, a Ca compound, a Ti compound or a Zr compound is employed.

(Calcination of Starting Materials)

If necessary, the starting materials of a piezoelectric ceramic according to the present invention may be calcined before producing a molded body thereof. The process of calcination is preferably conducted at temperatures between 600° C. and 1,050° C. The powder obtained as a result of a calcination process is referred to as calcined powder.

Dissolution as solid of different metal elements can be promoted without causing the crystal growth process to advance excessively by using a calcination process. First crystal grains and second crystal grains can be prepared separately by utilizing such a calcination process. For example, to obtain calcined powder (first powder) that operates as precursor of first crystal grains having a perovskite structure, the starting materials are mixed such that the molar quantity of the site A elements and the molar quantity of the site B elements become equal to each other or only represent a difference of not greater than 2 mol % and the mixture is subjected to a calcination process. The site A elements include Ba and Ca and the site B elements include Ti and Zr. First powder may contain one or more than one additional elements such as Mn. To obtain calcined powder (second powder) that operates as precursor of second crystal grains having a crystal structure (non-perovskite structure) that is different from the crystal structure of first powder, the starting materials are mixed such that the target metal composition ratio of second crystal grains may be obtained and then the mixture is subjected to a calcination process. The above-described metal composition ratio is preferably a mole ratio that makes Ti in excess or short of Ba. A ceramic in which second crystal grains are located at grain boundaries between first crystal grains can be manufactured by mixing the calcined powders (the first powder and the second powder) at an appropriate ratio and granulating, molding and sintering the mixture. The mixing ratio of the first powder and the second powder is preferably that the first powder takes not less than 95 mass % and not more than 99.9 mass %.

(Granulated Powder and Molded Body)

The expression of a molded body as used herein is a solid object obtained by molding solid powder. Molding techniques that can be used for the purpose of the present invention include monoaxial pressurization, cold hydrostatic pressurization, hot hydrostatic pressurization, cast molding and extrusion molding. Preferably, granulated powder is used to produce a molded body. The use of a technique of producing a molded body by using granulated powder and sintering it provides an advantage that a uniform size distribution of the crystal grains of the sintered body can be achieved with ease.

While there are no particular limitations to the method of granulating the powdery starting materials of a piezoelectric ceramic for the purpose of the present invention, the most preferable granulating method is the spray dry method from the viewpoint of uniformizing the grain diameters of the granulated powder.

Binders that can be used at the time of granulation for the purpose of the present invention include PVA (polyvinyl alcohol), PVB (polyvinyl butyral) and acryl-based resins. The ratio to which the binder is added is preferably between 1 weight part to 10 weight parts relative to 100 weight parts of the powdery starting materials of the piezoelectric ceramic, more preferably between 2 weight parts and 5 weight parts from the viewpoint of raising the density of the molded body.

(Sintering)

There are no particular limitations to the technique of sintering a molded body for the purpose of the present invention. Examples of sintering techniques that can be used for the purpose of the present invention include sintering by means of an electric furnace, sintering by means of a gas furnace, resistance heating, microwave sintering, milliwave sintering and HIP (hot isotropic press). Sintering by means of an electric furnace or a gas furnace may involve the use of a continuous furnace or a batch furnace.

While there are no particular limitations to the sintering temperature of the sintering technique to be used for the purpose of the present invention, it is preferably such that the involved compounds react with each other and represent a satisfactory crystal growth at the selected sintering temperature. A preferable temperature range is not lower than 1,100° C. and not higher than 1,380° C., more preferably not lower than 1,100° C. and not higher than 1,340° C. from the viewpoint of confining the grain diameters to between 500 nm and 10 $\mu$m. A piezoelectric ceramic sintered in the above temperature range represents an excellent piezoelectric constant. In order to reproducibly stabilize the characteristics of the piezoelectric ceramics obtained by way of a sintering process, the sintering process is preferably conducted for a period not shorter than 2 hours and not longer than 48 hours at a constant sintering temperature within the above range. While a two-step sintering technique may be employed, the use of a technique that does not involve any rapid temperature changes is preferable from the viewpoint of productivity.

After polishing a piezoelectric ceramic obtained as a result of a sintering process, it is preferably heat-treated at a temperature not lower than 1,000° C. When a piezoelectric ceramic is mechanically polished, residual stress arises in the inside of the piezoelectric ceramic. However, the residual stress will be alleviated and the piezoelectric characteristic of the piezoelectric ceramic will be further improved as a result of a heat treatment at a temperature not lower than 1,000° C. A heat treatment provides an additional effect of removing the powder of the starting materials such as barium carbonate that is deposited at grain boundaries. There are no particular limitations to the duration of the heat treatment, it is preferably no shorter than 1 hour.

(Piezoelectric Element)

Now, a piezoelectric element according to the present invention will be described below. FIG. 1 is a schematic illustration of a piezoelectric element according to the present invention, representing an exemplary configuration thereof. A piezoelectric element according to the present invention includes at least a first electrode 1, a piezoelectric ceramic section 2 and a second electrode 3 and is characterized in that the ceramic section 2 is formed by using a piezoelectric ceramic according to the present invention.

Because a piezoelectric element according to the present invention is provided at least with a first electrode and a second electrode, the piezoelectric characteristics of the element can be evaluated by using the electrodes. Each of the first electrode and the second electrode is formed by using an electroconductive layer having a thickness between 5 nm and 10 $\mu$m. There are no particular limitations to the material of the electrodes. In other words, it may be selected from the materials that are normally employed for piezoelectric elements. Examples of materials that can be used for the electrodes include metals such as Ti, Pt, Ta, Ir, Sr, In, Sn, Au, Al, Fe, Cr, Ni, Pd, Ag and Cu as well as their compounds.

The first electrode and the second electrode may be formed by using a single material selected from the above-listed ones or by producing a multilayer structure of two or more than two of the above-listed materials. The first electrode and the second electrode may be formed by using respective materials that are different from each other.

There are no particular limitations to the method of manufacturing the first electrode and the second electrode. They may be formed by baking a metal paste or by means of sputtering or vapor deposition. Alternatively, the first and second electrodes may be formed by patterning to make them represent a desired profile.

(Polarization)

It is preferable for a piezoelectric element according to the present invention that the polarization axis of the piezoelectric ceramic thereof is aligned in a certain direction. A large piezoelectric constant can be obtained for the piezoelectric element when the polarization axis is aligned in a certain direction. There are no particular limitations to the technique of polarizing the piezoelectric element. The polarization process may be conducted in the atmosphere or in silicon oil. While the temperature of polarization is preferably between 60° C. and 150° C., there are no particular limitations to the temperature of polarization because the optimum conditions of polarization vary to a certain extent as a function of the composition of the piezoelectric ceramic that the piezoelectric element includes. The intensity of the electric field to be used for the polarization process is preferably between 800 V/mm and 2.0 kV/mm.

(Measurement of Piezoelectric Constant and Mechanical Quality Factor by Resonance/Anti-Resonance Method)

The piezoelectric constant and the mechanical quality factor of a piezoelectric element can be computationally determined on the basis of the related standard of the Japan Electronics and Information Technology industries Association (JEITA EM-4501) from the results of measurement of the resonance frequency and the anti-resonance frequency obtained by means of a commercially available impedance analyzer. This method will be referred to as the resonance/anti-resonance method hereinafter.

(Laminated Piezoelectric Element)

Now, a laminated piezoelectric element according to the present invention will be described below. A laminated piezoelectric element according to the present invention is formed by alternately laying piezoelectric ceramic layers and electrode layers that include internal electrodes one on the other and characterized in that the piezoelectric ceramic layers include respective piezoelectric ceramics according to the present invention.

Figure 2A:
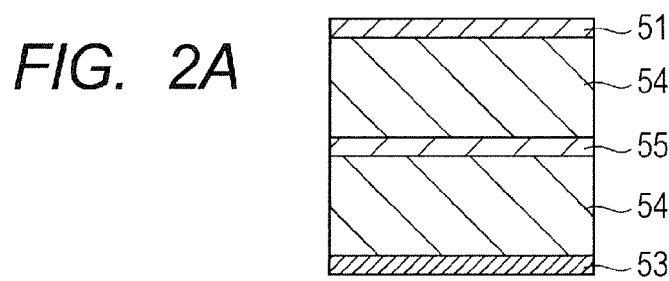
FIGS. 2A and 2B are schematic cross-sectional views of two different embodiments of laminated piezoelectric element according to the present invention, representing exemplary configurations thereof.
Figure 2B:
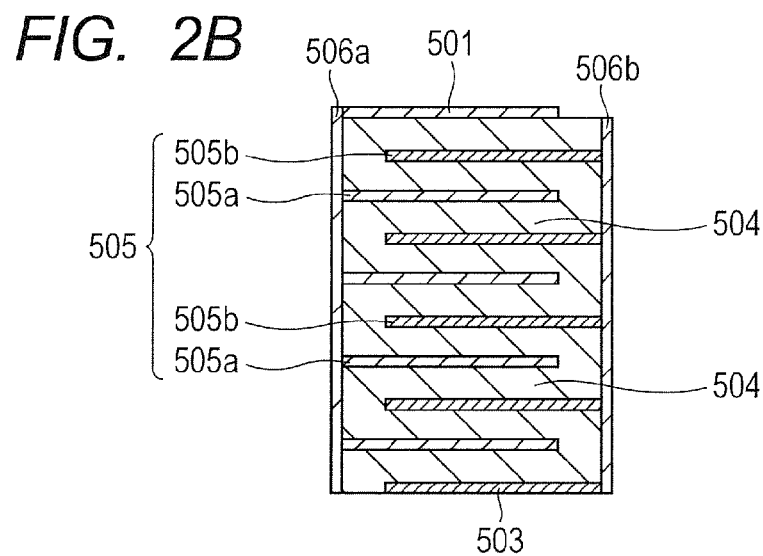

FIGS. 2A and 2B are schematic cross-sectional views of two different embodiments of laminated piezoelectric element according to the present invention, representing exemplary configurations thereof. A laminated piezoelectric element according to the present invention includes piezoelectric ceramic layers and electrode layers that include internal electrodes that are alternately laid one on the other and is characterized in that the piezoelectric ceramic layers include respective piezoelectric ceramics according to the present invention. The electrode layers may include external electrodes for sandwiching the laminated structure from outside in addition to the internal electrodes.

FIG. 2A schematically illustrates the arrangement of a laminated piezoelectric element according to the present invention which includes two piezoelectric ceramic layers 54 and a single internal electrode layer 55 interposed between the piezoelectric ceramic layers and the laminated structure is sandwiched between a first electrode 51 and a second electrode 53. The number of piezoelectric ceramic layers and that of internal electrode layers may be increased as illustrated in FIG. 2B and there are no particular limitations to the number of layers. The laminated piezoelectric element illustrated in FIG. 2B is formed by alternately laying nine piezoelectric ceramic layers 504 and eight internal electrode layers 505 (505a and 505b) and the piezoelectric layers of the laminated structure is sandwiched between a first electrode 501 and a second electrode 503. It also has external electrodes 506a and 506b for short-circuiting the eight layers of internal electrodes alternately to the left and to the right.

The sizes and the profiles of the internal electrodes 55, 505, the external electrodes 506a, 506b, the first electrodes 51, 501 and the second electrodes 53,503 do not necessarily have to be congruent with those of the piezoelectric ceramic layers 54, 504 and may be divided into a plurality of parts.

The internal electrodes 55, 505, the external electrodes 506a, 506b, the first electrodes 51, 501 and the second electrodes 53,503 are formed as so many electroconductive layers having a thickness between about 5 nm and about 10 μm. There are no particular limitations to the material of the electrodes. In other words, it may be selected from the materials that are normally employed for piezoelectric elements. Examples of materials that can be used for the electrodes include metals such as Ti, Pt, Ta, Ir, Sr, In, Sn, Au, Al, Fe, Cr, Ni, Pd, Ag and Cu and their compounds. The internal electrodes 55, 505 and the external electrodes 506a, 506b may be made of one of the above-listed metals, a mixture of any two of them or an alloy of any of them. Still alternatively laminated electrodes of two or more than two of the above-listed materials may be used for them. The plurality of electrodes may be made of respective materials that are different from each other.

Preferably, the internal electrodes 55, 505 contains Ag and Pd and the Ag content by weight M1 and the Pd content by weight M2 represent a weight ratio M1/M2 of $0.25 \leq M1/M2 \leq 4.0$. When the weight ratio M1/M2 is less than 0.25, the sintering temperature of the internal electrodes becomes high and hence such a weight ratio is not desirable. When, on the other hand, the weight ratio M1/M2 is more than 4.0, the internal electrodes represent an island structure and hence an intra-plane inhomogeneous state. Therefore, such a weight ratio is not desirable either. More preferably, the weight ratio is $0.3 \leq M1/M2 \leq 3.0$.

From the viewpoint of obtaining less expensive electrode materials, the internal electrodes 55, 505 preferably contain at least Ni or Cu. When the internal electrodes 55, 505 contain at least Ni or Cu, the laminated piezoelectric element of the present invention is preferably baked in a reducing atmosphere.

As illustrated in FIG. 2B, the plurality of electrodes of a piezoelectric element according to the present invention including the internal electrodes may be short-circuited with each other for the purpose of making the phases of the drive voltage that is applied to them agree with each other. When, for example, internal electrodes 505a and internal electrodes 505b are alternately arranged, the internal electrodes 505a and the first electrodes 501 may be short-circuited at the external electrodes 506a, while the internal electrodes 505b and the second electrodes 503 may be short-circuited at the external electrodes 506b. There are no particular limitations to the mode of short-circuiting of electrodes. Electrodes and wires may be arranged at some of the lateral surfaces of the laminated piezoelectric element for the purpose of short-circuiting. One or more than one through holes that run through the piezoelectric ceramic layers 504 may be formed and an electroconductive material may be arranged in the inside of the through holes for the purpose of short-circuiting the electrodes.

(Liquid Ejection Head)

Now, a liquid ejection head according to the present invention will be described below. A liquid ejection head according to the present invention is characterized in that it includes a liquid chamber having a vibrating section that is provided with a piezoelectric element or a laminated piezoelectric element according to the present invention and an ejection port that communicates with the liquid chamber.

Figure 3A:
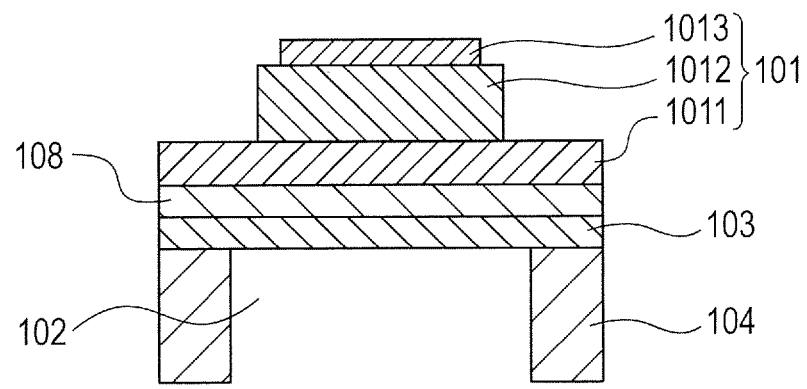
FIGS. 3A and 3B are schematic illustrations of a liquid ejection head according to the present invention, representing an exemplary configuration thereof.
Figure 3B:
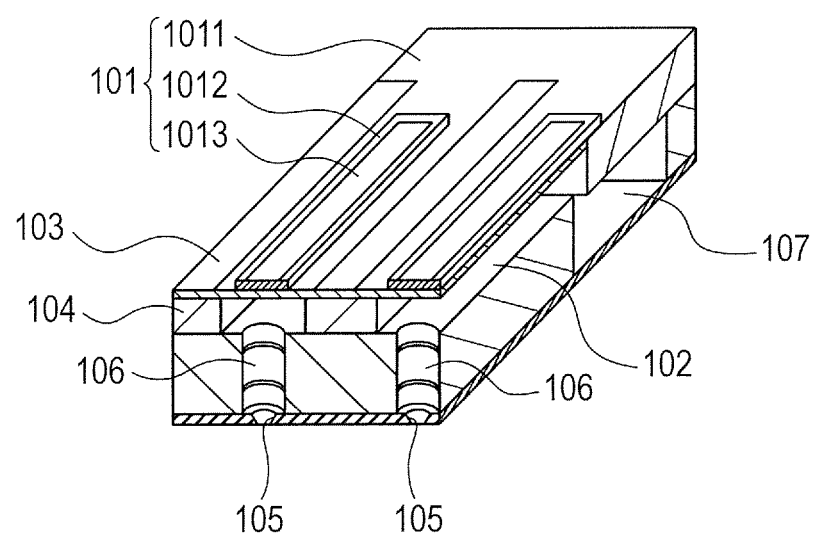

FIGS. 3A and 3B are schematic illustrations of an embodiment of liquid ejection head according to the present invention, representing the configuration thereof. As illustrated in FIG. 3B, a liquid ejection head according to the present invention is a liquid ejection head including a piezoelectric element 101 according to the present invention. The piezoelectric element 101 includes at least a first electrode 1011, a piezoelectric ceramic 1012 and a second electrode 1013. If necessary, the piezoelectric ceramic 1012 may be subjected to a patterning process so as to be patterned as illustrated in FIG. 3B.

The liquid ejection head illustrated in FIG. 3B includes ejection ports 105, individual liquid chambers 102, communication holes 106 respectively linking the individual liquid chambers 102 and the corresponding ejection ports 105, a liquid chamber partition wall 104, a common liquid chamber 107, a vibrating plate 103 and the piezoelectric element 101. While the piezoelectric element 101 in FIGS. 3A and 3B illustrates rectangular side views, it may alternatively represent views other than rectangular ones such as elliptical, circular or parallelogramic views. Generally, the piezoelectric ceramic 1012 represents a profile that reflects the profile of the individual liquid chambers 102.

Now, the piezoelectric element 101 that a liquid ejection head according to the present invention includes and its surrounding area will be described in detail by referring to FIG. 3A. FIG. 3A is a schematic cross-sectional view of the piezoelectric element illustrated in FIG. 3B taken in the width-direction thereof. While the piezoelectric element represents a rectangular cross-sectional view, it may alternatively represent a trapezoidal view or an inverted trapezoidal view.

Referring to FIG. 3A, the first electrode 1011 is made to operate as lower electrode and the second electrode 1013 is made to operate as upper electrode. However, the arrangement of the first electrode 1011 and the second electrode 1013 is not limited to the illustrated one. For example, the first electrode 1011 may be made to operate either as lower electrode or as upper electrode. Similarly, the second electrode 1013 may be made to operate either as upper electrode or as lower electrode. A buffer layer 108 may be arranged between the vibrating plate 103 and the lower electrode. The differences in the terminology are attributable to the manufacturing method of the device and the advantages of the present invention will be secured regardless of the terminology.

In the above-described liquid ejection head, the vibrating plate 103 is displaced up and down as the piezoelectric ceramic 1012 is expanded and contracted to in turn apply pressure to the liquid in the individual liquid chamber 102. Then, as a result, liquid is ejected from the ejection port 105. A liquid ejection head according to the present invention can find applications for printers and in manufacturing electronic devices.

The thickness of the vibrating plate 103 is not less than 1.0 μm and not more than 15 μm, preferably not less than 1.5 μm and not more than 8 μm. While there are no limitations to the material of the vibrating plate, it is preferably Si. The Si of the vibrating plate may or may not be doped with boron or phosphor. The buffer layer and the electrode layer on the vibrating plate may be integrally formed with the vibrating plate. The thickness of the buffer layer 108 is not less than 5 nm and not more than 300 nm, preferably not less than 10 nm and not more than 200 nm. The size of the ejection ports 105 is not less than 5 nm and not more than 40 μm in terms of circle equivalent diameter. The ejection ports 105 may be circle-shaped, star-shaped or polygon-shaped, trigon-shaped in particular.

(Liquid Ejection Device)

Now, a liquid ejection device according to the present invention will be described below. A liquid ejection device according to the present invention is characterized in that it includes a mounting section for supporting a transfer medium (i.e. an object for receiving an image to be transferred) and a liquid ejection head according to the present invention.

Figure 4:
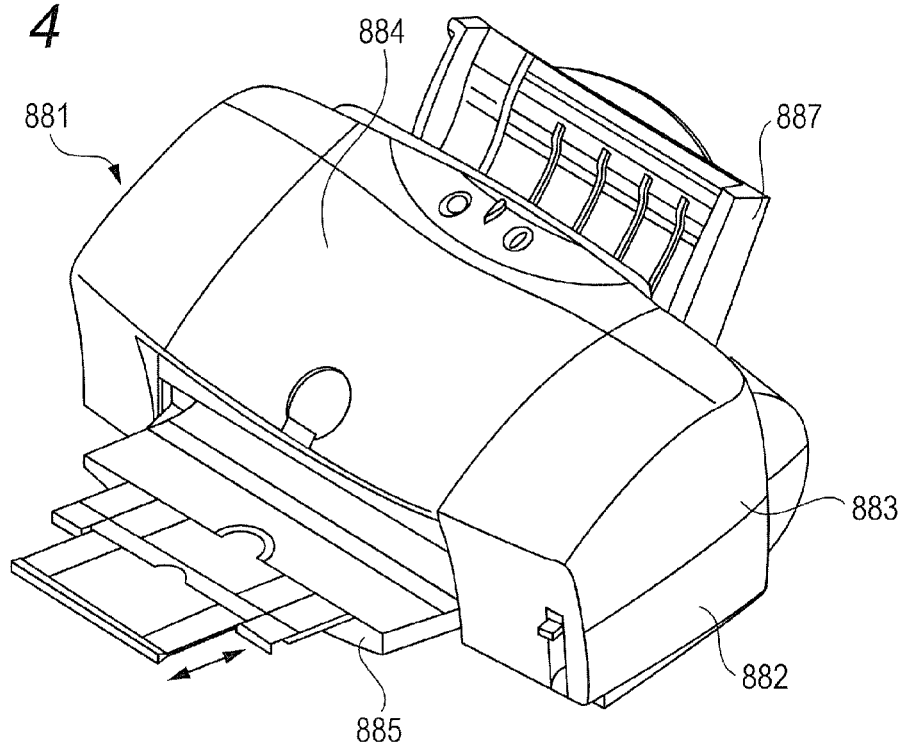
FIG. 4 is a schematic illustration of an embodiment of liquid ejection device according to the present invention.
Figure 5:
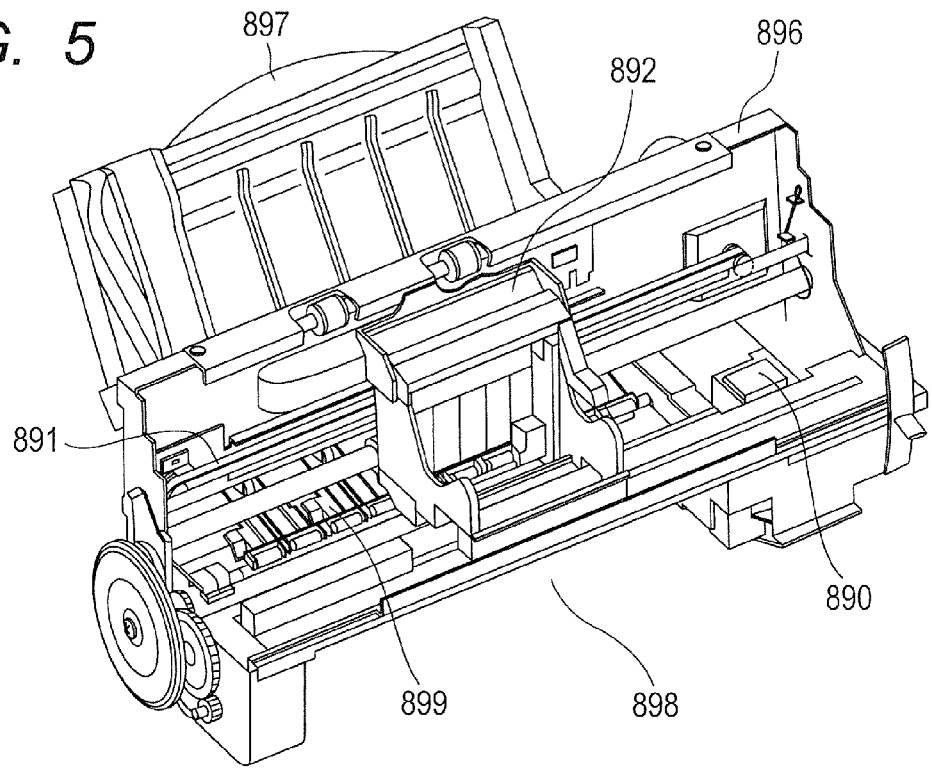
FIG. 5 is another schematic illustration of the embodiment of liquid ejection device of FIG. 4, showing the inside thereof.

For example, a liquid ejection device according to the present invention may be an inkjet recording apparatus as illustrated in FIGS. 4 and 5. FIG. 5 illustrates the liquid ejection device (inkjet recording apparatus) 881 of FIG. 4 from which the exterior members 882 through 885 and 887 are removed. The inkjet recording apparatus 881 includes an automatic feed section 897 for automatically feeding a sheet of recording paper to the inside of the apparatus main body 896 as a transfer medium. It additionally is provided with three sites necessary for leading the sheet of recording paper fed from the automatic feed section 897 to a predetermined recording position and then from the recording position to the discharge port 898.

More specifically, the inkjet recording apparatus 881 is provided with a transfer section 899 that is a mounting section for supporting a transfer medium, a recording section 891 for recording on the sheet of recording paper transferred to the recording position and a restoration section 890 for executing a restoration process on the recording section 891. By turn, the recording section 891 is provided with a carriage 892 for containing a liquid ejection head according to the present invention. The carriage 892 is driven to reciprocally move on a rail.

In an inkjet recording apparatus having the above-described configuration, the piezoelectric ceramic is displaced as the carriage 892 is driven to move on the rail by an electric signal transmitted from a computer and a drive voltage is applied to the electrodes that sandwich the piezoelectric ceramic. As a result of the displacement of the piezoelectric ceramic, pressure is applied to the individual liquid chambers 102 by way of the vibrating plates 103 illustrated in FIG. 3B. Then, ink is ejected from the ejection ports 105 for a printing operation.

A liquid ejection device according to the present invention can be operated to eject liquid uniformly at high speed. Additionally, the device is suited for downsizing.

While a liquid ejection device according to the present invention is illustrated and described above as a printer, a liquid ejection device according to the present invention can find applications in the field of inkjet recording apparatus used in facsimile machines, copying machines and composite machines as well as in the field of industrial liquid ejection apparatus.

Additionally, the user of a liquid ejection device according to the present invention can select a desired transfer medium according to the purpose of the use of the liquid ejection device. A liquid ejection device according to the present invention may be so arranged that the liquid ejection head thereof is allowed to move relative to the transfer medium that is placed on the stage, or the mounting section.

(Ultrasonic Motor)

Now, an ultrasonic motor according to the present invention will be described below. An ultrasonic motor according to the present invention is characterized in that it includes at least a vibrator having a piezoelectric element or a laminated piezoelectric element according to the present invention and a mobile body that is held in contact with the vibrator.

Figure 6A:
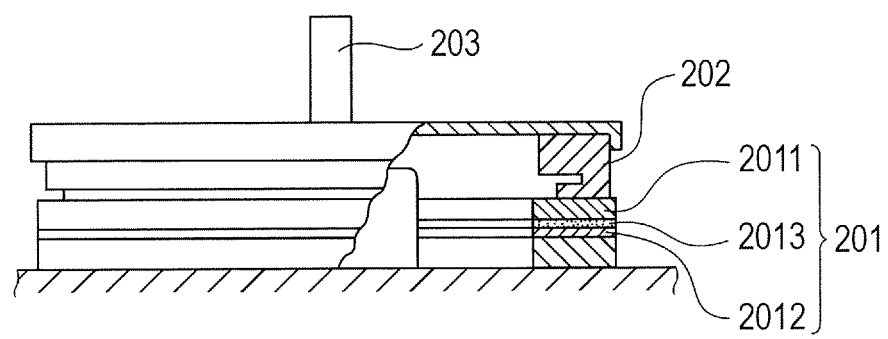
FIGS. 6A and 6B are schematic illustrations of two different embodiments of ultrasonic motor according to the present invention, representing exemplary configurations thereof.
Figure 6B:
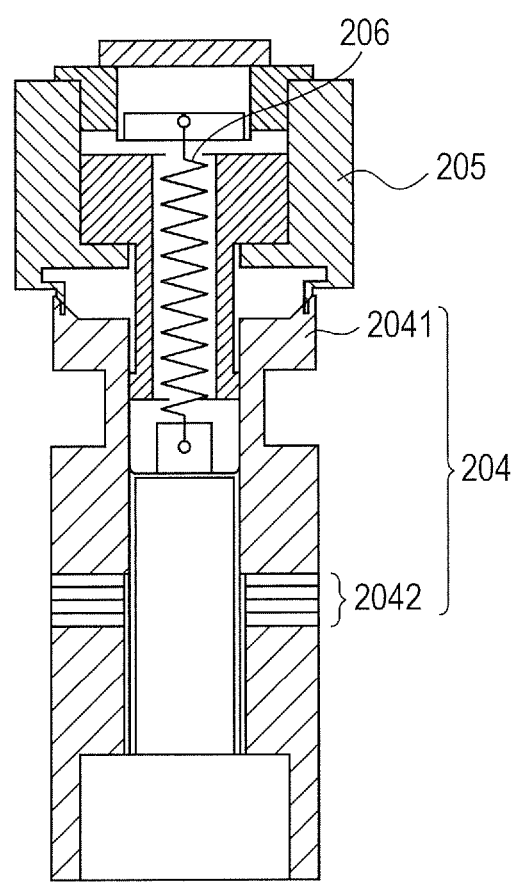

FIGS. 6A and 6B are schematic illustrations of two different embodiments of ultrasonic motor according to the present invention, representing exemplary configurations thereof. FIG. 6A illustrates an ultrasonic motor including a piezoelectric element according to the present invention, the piezoelectric element being formed by a single plate. The ultrasonic motor includes a vibrator (stator) 201, a rotor 202 held in contact with the sliding surface of the vibrator 201 by the pressure applied to it by a pressure applying spring (not illustrated) and an output shaft 203 integrally arranged with the rotor 202. The vibrator 201 is formed by using a metal-made elastic ring 2011, a piezoelectric element 2012 according to the present invention and an organic adhesive agent 2013 (epoxy-based adhesive, cyanoacrylate-based adhesive or the like) for causing the piezoelectric element 2012 to adhere to the metal-made elastic ring 2011. The piezoelectric element 2012 according to the present invention includes a piezoelectric ceramic that is sandwiched between a first electrode and a second electrode (not illustrated).

As two alternating current voltages whose phases are shifted to each other by odd number times of n/2 are applied to the piezoelectric element, a flexural progressive wave is generated in the vibrator 201 and each and every point on the sliding surface of the vibrator 201 comes to represent an elliptic movement. When the rotor 202 is held in contact with the sliding surface of the vibrator 201 under pressure, the rotor 202 is driven to rotate in the direction opposite to that of the flexural progressive wave due to the frictional force it receives from the vibrator 201. The object to be driven (not illustrated) is bonded to the output shaft 203 and driven by the turning force of the rotor 202.

As a voltage is applied to the piezoelectric ceramic, the piezoelectric ceramic extends and contracts due to the transverse piezoelectric effect. When an elastic body such as a metal body is bonded to the piezoelectric element, the elastic body is bent by the extension/contraction of the piezoelectric ceramic. Ultrasonic motors of the above-described type are based on this principle.

FIG. 6B illustrates an ultrasonic motor including a piezoelectric element having a laminated structure. Referring to FIG. 6B, the vibrator 204 includes a laminated piezoelectric element 2042 sandwiched between cylindrical and elastic metal bodies 2041. The laminated piezoelectric element 2042 is an element formed by using a laminated piezoelectric ceramic having a plurality of layers (not illustrated) and includes a first electrode and a second electrode arranged at the outer surface of the laminate and internal electrodes arranged at the inner surfaces of the laminate. The elastic metal bodies 2041 are bound together by bolts and rigidly hold the laminated piezoelectric element 2042 between them to produce a vibrator 204.

As two alternating current voltages having different phases are applied to the laminated piezoelectric element 2042, the vibrator 204 excites two vibrations that orthogonally intersect each other. The two vibrations are synthesized to produce a circular vibration for driving the front end part of the vibrator 204. Note that a constricted part, or a circumferential groove, is formed at an upper part of the vibrator 204 to amplify the displacement of vibration for driving the object to be driven.

The rotor 205 is brought into contact with the vibrator (stator) 204 under the pressure of the pressurizing spring 206 to obtain frictional force necessary for driving the object to be driven. The rotor 205 is rotatably supported by a bearing.

(Optical Instrument)

Now, an optical instrument according to the present invention will be described below. An optical instrument according to the present invention is characterized in that it includes an ultrasonic motor according to the present invention as described above that is arranged in the drive section thereof.

Figure 7A:
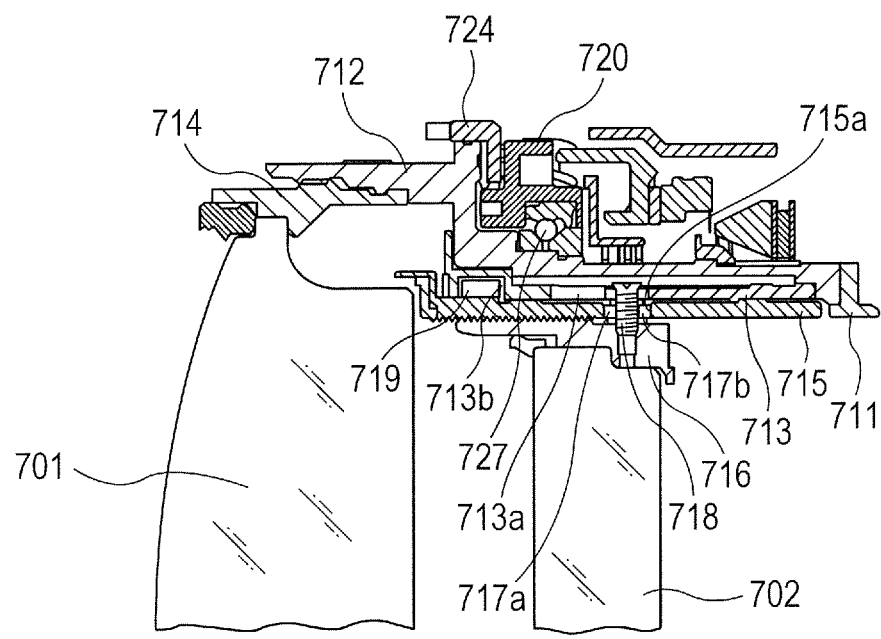
FIGS. 7A and 7B are schematic illustrations of an embodiment of optical instrument according to the present invention.
Figure 7B:
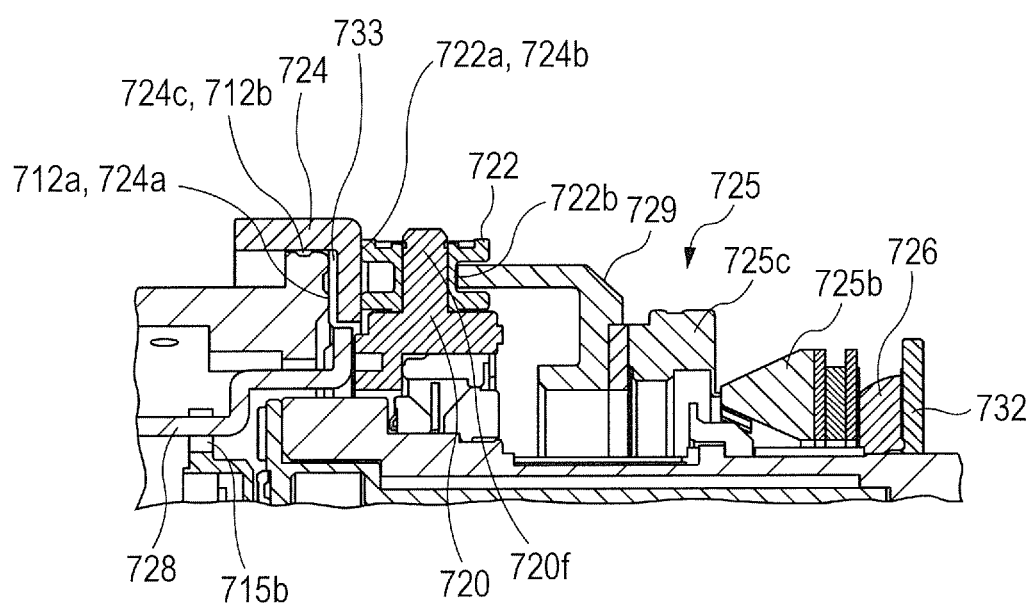
Figure 8:
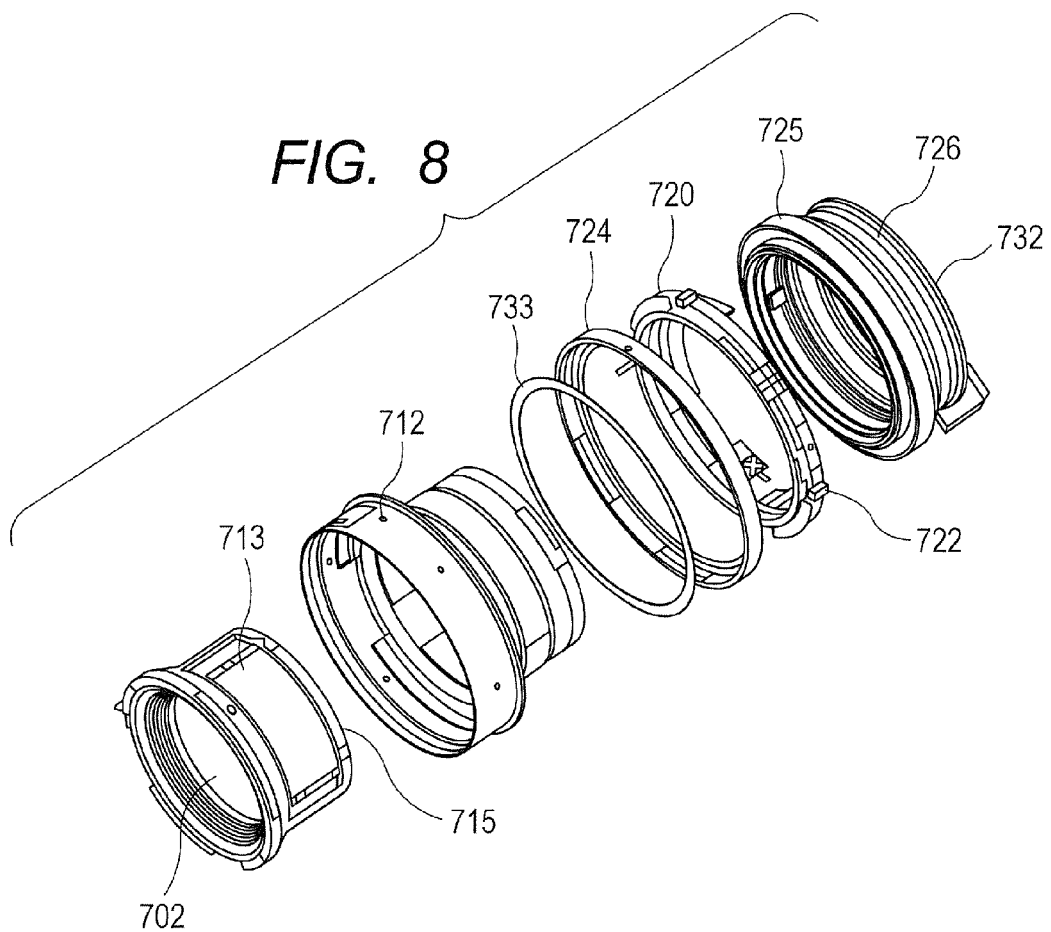
FIG. 8 is another schematic illustration of the embodiment of optical instrument of FIGS. 7A and 7B.

FIGS. 7A and 7B are schematic cross-sectional views of a major part of a preferable embodiment of optical instrument according to the present invention, which is an interchangeable lens barrel of a single lens reflex camera. FIG. 8 is an exploded schematic perspective view of the preferable embodiment of optical instrument according to the present invention, which is an interchangeable lens barrel that belongs to a single lens reflex camera. A fixed barrel 712 that is engaged with a front group barrel 714 for holding a front group lens 701 and a straight guide barrel 713 for guiding a rear group lens barrel 716 for holding a rear group lens (focusing lens) 702 are rigidly fitted to the removable mount 711 for the camera. These are fixed members of the interchangeable lens barrel.

A straight guide groove 713a that runs in parallel with the optical axis of the camera and is to be used for the focusing lens 702 is formed in the straight guide barrel 713. Cam rollers 717a, 717b that extend radially outwardly are rigidly secured to the rear group barrel 716, which holds the focusing lens 702, by means of an axle screw 718 and the cam roller 717a is fitted into the straight guide barrel 713a.

A cam ring 715 is rotatably fitted to the inner periphery of the straight guide barrel 713. Any relative movement between the straight guide barrel 713 and the cam ring 715 in the direction of the optical axis is restricted because a roller 719 that is rigidly secured to the cam ring 715 is fitted into the circumferential groove 713 of the straight guide barrel 713. A cam groove 715a for the focusing lens 702 is formed in the cam ring 715 and the above-described cam roller 717b is also fitted into the cam groove 715a.

A rotational transmission ring 720 that is held to the fixed barrel 712 by a ball race 727 so as to be rotatable at a fixed position relative to the fixed barrel 712 is arranged at the outer peripheral side of the fixed barrel 712. At the rotational transmission ring 720, rollers 722 are rotatably held to a shaft 720f that radially extends from the rotational transmission ring 720 and a diametrically enlarged part 722a of each of the rollers 722 is held in contact with the mount side end facet 724b of the manual focusing ring 724. On the other hand, a diametrically reduced part 722b of each of the rollers 722 is held in contact with a junction member 729. A total of six rollers 722 are arranged at regular intervals at the outer periphery of the rotational transmission ring 720 and the above description applies to each of the rollers.

A low friction sheet (washer member) 733 is arranged in an radially inner part of the manual focusing ring 724 and the low friction sheet is pinched between the mount side end facet 712a of the fixed barrel 712 and the front side end facet 724a of the manual focusing ring 724. The radially outer surface of the low friction sheet 733 is ring-shaped and radially held in engagement with the radial inside 724c of the manual focusing ring 724. Additionally, the radial inside 724c of the manual focusing ring 724 is radially engaged with the radial outside section 712b of the fixed barrel 712. The low friction sheet 733 takes a role of reducing the friction in the rotary ring mechanism in which the manual focusing ring 724 rotates around the optical axis relative to the fixed barrel 712.

Note that the diametrically enlarged part 722a of each of the rollers 722 and the mount side end facet 724b of the manual focusing ring are held in contact with each other in a pressurized state due to the pressure that the wave washer 726 applies so as to push the ultrasonic motor 725 to the front side of the lens. Likewise, the diametrically reduced part 722b of each of the rollers 722 and the junction member 729 are held in contact with each other in an appropriately pressurized state due to the pressure that the wave washer 726 applies to forwardly push the ultrasonic motor 725. Any movement of the wave washer 726 in the direction toward the mount is restricted by the washer 732 that is held in bayonet connection relative to the fixed barrel 712. The spring force (elastically urging force) that the wave washer 726 generates is transmitted to the ultrasonic motor 725 and further to the rollers 722 and operates as force for pushing the manual focusing ring 724 against the mount side end facet 712a of the fixed barrel 712. In other words, the manual focusing ring 724 is assembled in a sate where it is pushed against the mount side end facet 712a of the fixed barrel 712 by way of the low friction sheet 733.

Therefore, as the ultrasonic motor 725 is driven to rotate relative to the fixed barrel 712 by a control section (not illustrated), the rollers 722 rotate around the shaft 720f because the junction member 729 is held in frictional contact with the diametrically reduced parts 722b of the rollers 722. As the rollers 722 rotate around the shaft 720f, consequently the rotational transmission ring 720 rotates around the optical axis (automatic focusing operation).

Additionally, as turning force around the optical axis is applied from the manual operation input section (not illustrated) to the manual focusing ring 724, it brings forth the effect that will be described below.

Namely, since the mount side end facet 724b of the manual focusing ring 724 is held in contact with the diametrically enlarged parts 722a of the rollers 722 under pressure, the rollers 722 are forced to rotate around the shaft 720f by frictional force. As the diametrically enlarged parts 722a of the rollers 722 rotate around the shaft 720f, the rotational transmission ring 720 is forced to rotate around the optical axis. At this time, the ultrasonic motor 725 does not rotate due to the frictional holding force between the rotor 725c and the stator 725b (manual focusing operation).

A pair of focus keys 728 are fitted to the rotational transmission ring 720 at two oppositely disposed positions such that the focus keys 728 are engaged with the notches 715b formed at the front end of the cam ring 715. Then, as a result, as an automatic focusing operation or a manual focusing operation is conducted and the rotational transmission ring 720 is driven to rotate around the optical axis, the turning force of the rotational transmission ring 720 is transmitted to the cam ring 715 by way of the focus keys 728. As the cam ring is driven to rotate around the optical axis, the rear group barrel 716 whose rotary motion is restricted by the cam roller 717a and the straight guide groove 713a is forced to retreat along the cam groove 715a of the cam ring 715 by the cam roller 717b. Then, as a result, the focusing lens 702 is driven to perform a focusing operation.

While an optical instrument according to the present invention is described above in terms of an interchangeable lens barrel of a single lens reflex camera, it can also find applications in the field of optical instruments having an ultrasonic motor in the drive section thereof. Such optical instruments include cameras of any types such as compact cameras and electronic still cameras.

(Vibration Device and Dust Removal Device)

Vibration devices that are utilized for transporting and removing grains, powder and liquid are being widely used in electronic instruments and so on. Now, a dust removal device that includes a piezoelectric element according to the present invention will be described below as an example of vibration device according to the present invention.

A dust removal device according to the present invention is characterized in that it includes at least a piezoelectric element or a laminated piezoelectric element that is arranged at a vibrating plate and has a function of removing the dust that adheres to the surface of the vibrating plate.

Figure 9A:
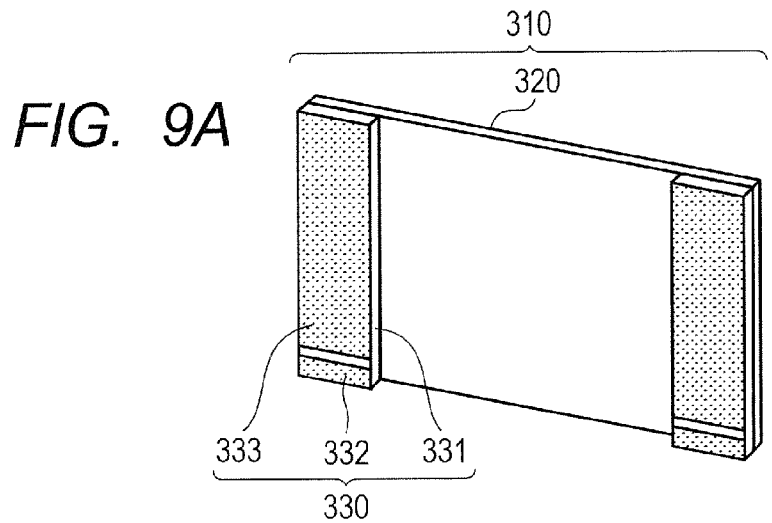
FIGS. 9A and 9B are schematic illustrations of an embodiment of vibration device according to the present invention that is adopted as a dust removal device.
Figure 9B:
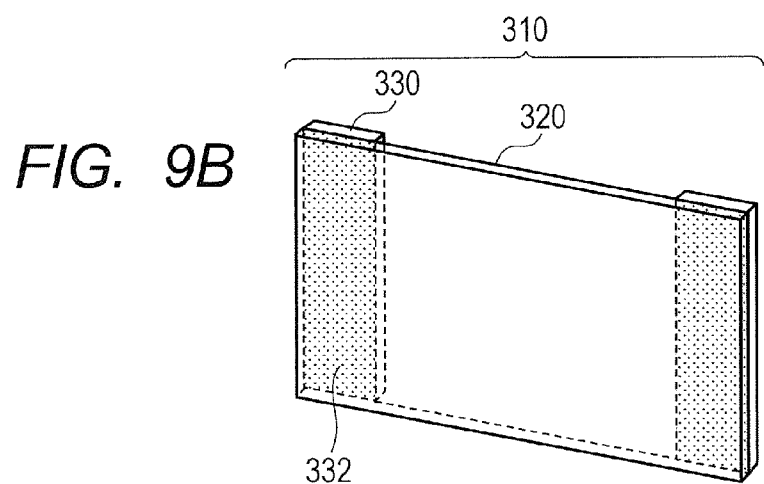

FIGS. 9A and 9B are schematic illustrations of an embodiment of dust removal device according to the present invention. The dust removal device 310 includes a pair of plate-shaped piezoelectric elements 330 and a vibrating plate 320. The piezoelectric elements 330 may be laminated piezoelectric elements according to the present invention. While there are no particular limitations to the material of the vibrating plate 320, any light transmitting material or any light reflecting material can be used for the vibrating plate 320 when the dust removal device 310 is designed so as to be used for an optical device. If such is a case, the light transmitting section or the light reflecting section of the vibrating plate becomes the object of dust removal.

Figure 10A:
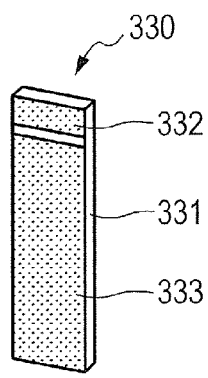
FIGS. 10A, 10B and 10C are schematic illustrations of an embodiment of dust removal device according to the present invention, representing the configuration of the piezoelectric element thereof.
Figure 10B:
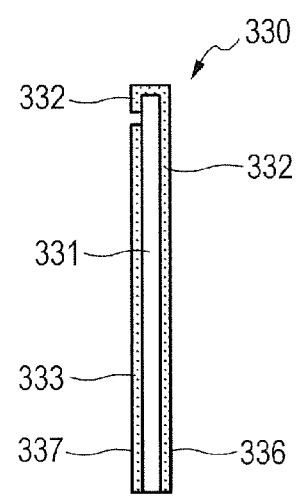
Figure 10C:
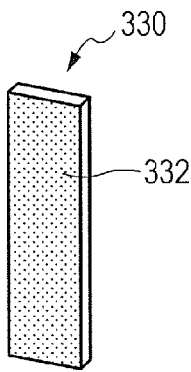

FIGS. 10A through 10C are schematic illustrations of the configuration of the piezoelectric elements 330 illustrated in FIGS. 9A and 9B. FIGS. 10A and 10C are illustrations of the configuration of the front surface and that of the rear surface of each of the piezoelectric elements 330 and FIG. 10B is an illustration of the configuration of the lateral surfaces of each of the piezoelectric elements 330. As illustrated in FIGS. 9A and 10A through 10C, each of the piezoelectric elements 330 includes a piezoelectric ceramic 331, a first electrode 332 and a second electrode 333, of which the first electrode 332 and the second electrode 333 are arranged so as to face the respective plate surfaces of the piezoelectric ceramic 331. The piezoelectric elements 330 may be laminated piezoelectric elements according to the present invention. If such is the case, each of the piezoelectric ceramics 331 is actually formed by alternately laying piezoelectric ceramic layers and internal electrodes. Then, a drive waveform can be applied to the piezoelectric ceramic layers with different phases by short-circuiting the internal electrodes alternately with the first electrodes 332 and the second electrodes 333. In FIG. 10C, the front side surface of the piezoelectric element 330 where the first electrode 332 is arranged is referred to as the first electrode surface 336. In FIG. 10A, the front side surface of the piezoelectric element 330 where the second electrode 333 is arranged is referred to as the second electrode surface 337.

An electrode surface as used herein refers to a surface of a piezoelectric element where an electrode is arranged. However, as illustrated in FIGS. 10A and 10B, the first electrode 332 may be extended all the way to the second electrode surface 337.

As illustrated in FIGS. 9A and 9B, the piezoelectric elements 330 and the vibrating plate 320 are rigidly secured to one of the plate surfaces of the vibrating plate 320 by means of the first electrode surfaces 336 of the piezoelectric elements 330. Then, as the piezoelectric elements 330 are driven to operate, stress arises between the piezoelectric elements 330 and the vibrating plate 320 to cause the vibrating plate 320 to generate out-of-plane vibrations. A dust removal device 310 according to the present invention is a device for removing foreign objects such as dust that adhere to the surfaces of the vibrating plate 320 by the out-of-plane vibrations of the vibrating plate 320. Out-of-plane vibrations refer to elastic vibrations that displace a vibrating plate in the direction of the optical axis which is the thickness direction of the vibrating plate.

FIGS. 11A and 11B are schematic illustrations of the vibration principle of a dust removal device 310 according to the present invention. FIG. 11A is a schematic illustration of the vibrations of the vibrating plate 320 of the dust removal device 310 as viewed from the thickness direction of the vibrating plate 320 in a state where an alternating current voltage is applied to the pair of piezoelectric elements 330 arranged left and right with the same phase to cause the vibrating plate 320 generate out-of-plane vibrations. At this time, the vibrating plate 320 is rigidly held in position at the locations indicated by the arrows so as not to move. The direction of polarization of the piezoelectric ceramics that the pair of piezoelectric elements arranged at left and right include is same with the thickness direction of the piezoelectric elements 330 and the dust removal device 310 is driven to operate in the seventh order vibration mode. FIG. 11B is a schematic illustration of the vibrations of the vibrating plate 320 in a state where an alternating current voltage is applied to the pair of piezoelectric elements 330 arranged left and right with opposite phases, the phase difference being 180°, to cause the vibrating plate 320 to generate out-of-plane vibrations. At this time again, the vibrating plate 320 is rigidly held in position at the locations indicated by the arrows so as not to move. The dust removal device 310 is driven to operate in the sixth order vibration mode. A dust removal device 310 according to the present invention is a device that can effectively remove the dust adhering to the surfaces of the vibrating plate by selectively using at least two vibration modes.

(Image Pickup Device)

Figure 13:
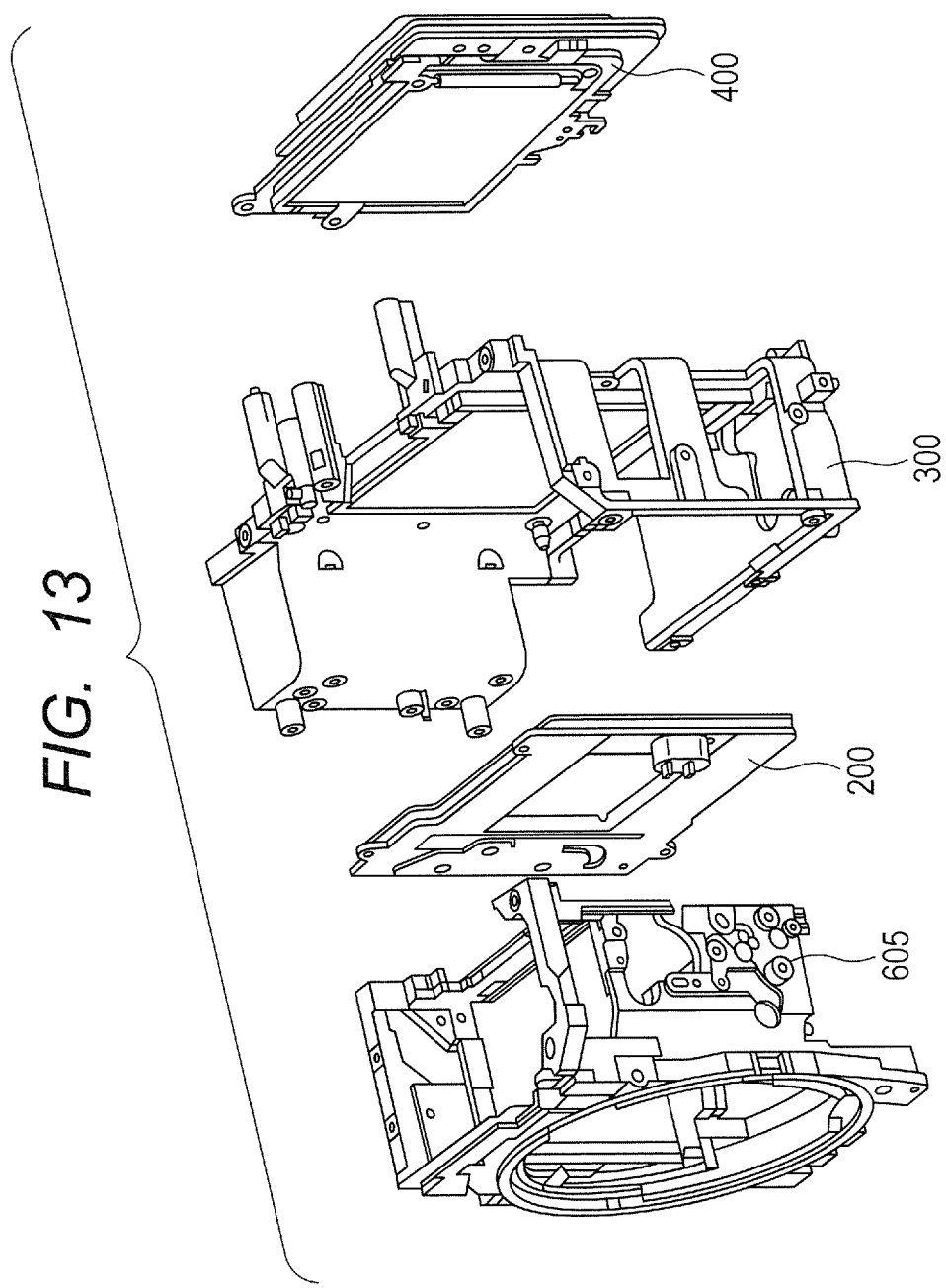
FIG. 13 is an exploded schematic illustration of the embodiment of image pickup device of FIG. 12.

Now, an image pickup device according to the present invention will be described below. An image pickup device according to the present invention is an image pickup device including at least a dust removal device and an image pickup element unit and is characterized in that the vibrating plate of the dust removal device is arranged at the light receiving surface side of the image pickup element unit. FIGS. 12 and 13 are schematic illustrations of a preferable embodiment of image pickup device according to the present invention, which is a digital single lens reflex camera.

FIG. 12 is a schematic perspective view of the camera main body 601, representing the front surface side of the camera as viewed from the side of the object to be shot by the camera in a state where the image pickup lens unit is removed. FIG. 13 is an exploded schematic perspective view of the camera so as to illustrate the peripheral structure of the dust removal device according to the present invention and the image pickup unit 400.

A mirror box 605 into which the picked-up bundle of rays is guided after passing through the image pickup lens is arranged in the camera main body illustrated in FIG. 12 and a main mirror 606 (quick return mirror) is arranged in the mirror box 605. The main mirror 606 can be either in a state where it is held at an angle of 45° relative to the optical axis of the image pickup optical system in order to guide the picked-up bundle of rays in the direction of the penta-roof mirror (not illustrated) or in a state where it is held to a position retracted from the picked-up bundle of rays in order to guide the picked-up bundle of rays in the direction of the image pickup element (not illustrated).

Referring to FIG. 13, the mirror box 605 and a shutter unit 200 are arranged at the side of the object to be shot by the camera of the main body chassis 300, which operates as the frame of the camera main body, in the above order as viewed from the side of the object. The above-described image pickup unit 400 is arranged at the image shooting person side of the main body chassis 300. The above-described image pickup unit 400 includes the vibrating plate of a dust removal device and an image pickup element unit. The vibrating plate of the dust removal device is arranged in front of the image pickup element unit coaxially with the optical axis of the light receiving surface of the image pickup element unit. The image pickup unit 400 is arranged at the fitting surface of the mount section 602 (FIG. 12) that operates as reference for fitting the image pickup lens unit in position and the image pickup surface of the image pickup element unit is positionally so adjusted that it is held in parallel with the image pickup lens unit with a predetermined gap interposed between them.

While an image pickup device according to the present invention is described above in terms of a digital single lens reflex camera, it may alternatively be a camera with interchangeable image pickup lens units such as a mirror-less type digital single lens camera having no mirror box. Furthermore, the present invention is applicable to various electronic/electric devices having any of various image pickup devices such as video cameras having interchangeable image pickup lens units, copying machines, facsimile machines, scanners and so on that require the dust adhering to the surface of the optical units thereof to be removed.

(Electronic Instrument)

Now, an electronic instrument according to the present invention will be described below. An electronic instrument according to the present invention is characterized in that it includes a piezoelectric acoustic unit having a piezoelectric element or a laminated piezoelectric element according to the present invention. For the purpose of the present invention, piezoelectric acoustic units include speakers, buzzers, microphones and surface acoustic wave (SAW) element among others.

Figure 14:
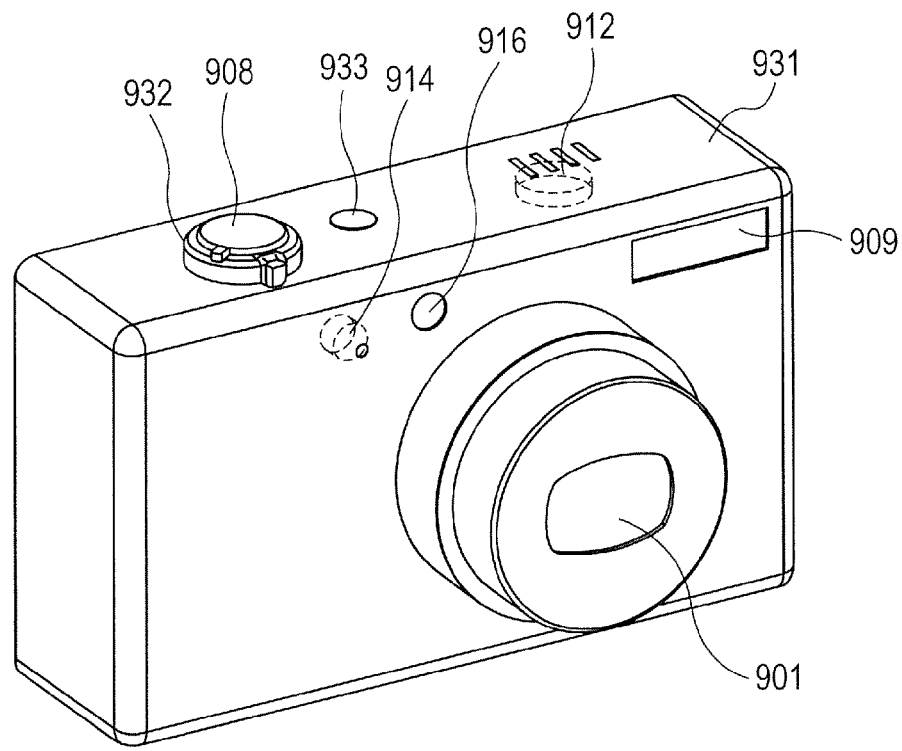
FIG. 14 is a schematic illustration of an embodiment of electronic instrument according to the present invention.

FIG. 14 is a schematic perspective view of the entire main body 931 of a digital camera which is a preferable embodiment of electronic instrument according to the present invention. An optical device 901, a microphone 914, a strobe luminescence device 909 and an auxiliary light unit 916 are arranged at the front side of the main body 931. The microphone 914 is embedded into the inside of the main body and hence indicated by broken lines. A hole for picking up sounds is formed in front of the microphone 914.

A power button 933, a speaker 912, a zoom lever 932 and a release button 908 for focusing operations are arranged on the top surface of the main body 931. The speaker 912 is embedded in the main body 931 and hence indicated by broken lines. Slits for emitting sounds to the outside are formed in front of the speaker 912.

For the purpose of the present invention, a piezoelectric acoustic unit is employed as at least one of the microphone 914, the speaker 912 and the surface acoustic wave element (not illustrated).

While an electronic device instrument according to the present invention is described above in terms of a digital camera, it can also find applications in the field of electronic instruments such as sound reproduction devices, sound recording devices, portable phones, information terminals and so on formed by using one or more than one piezoelectric acoustic units.

As described above, a piezoelectric element and a laminated piezoelectric element according to the present invention can suitably find applications in the field of liquid ejection heads, liquid ejection devices, ultrasonic motors, optical instruments, vibration devices, dust removal devices, image pickup devices and electronic instruments.

By using a piezoelectric element or a laminated piezoelectric element according to the present invention, it is possible to provide a liquid ejection head having a nozzle density and an ejection rate equal to or greater than those of any liquid ejection heads formed by using a lead-containing piezoelectric element.

Also by using a liquid ejection head according to the present invention, it is possible to provide a liquid ejection device having an ejection rate and an ejection accuracy equal to or greater than those of any liquid ejection devices formed by using a lead-containing piezoelectric element.

By using a piezoelectric element or a laminated piezoelectric element according to the present invention, it is possible to provide an ultrasonic motor representing a level of drive force and that of durability equal to or greater than those of any ultrasonic motor formed by using a lead-containing piezoelectric element.

By using an ultrasonic motor according to the present invention, it is possible to provide an optical instrument having a level of durability and that of driving accuracy equal to or greater than those of any optical instruments formed by using a lead-containing piezoelectric element.

By using a piezoelectric element or a laminated piezoelectric element according to the present invention, it is possible to provide a vibration device representing a level of vibration capacity and that of durability equal to or greater than those of any vibration devices formed by using a lead-containing piezoelectric element.

By using a vibration device according to the present invention, it is possible to provide a dust removal device representing a level of dust removal efficiency and that of durability equal to or greater than those of any dust removal devices formed by using a lead-containing piezoelectric element.

By using a dust removal device according to the present invention, it is possible to provide an image pickup device representing a dust removal capacity greater than that of any image pickup devices formed by using a lead-containing piezoelectric element.

By using a piezoelectric acoustic unit having a piezoelectric element or a laminated piezoelectric element according to the present invention, it is possible to provide an electronic instrument representing a level of sound emission performance greater than that of any electronic instruments formed by using a lead-containing piezoelectric element.

Figure 16A:
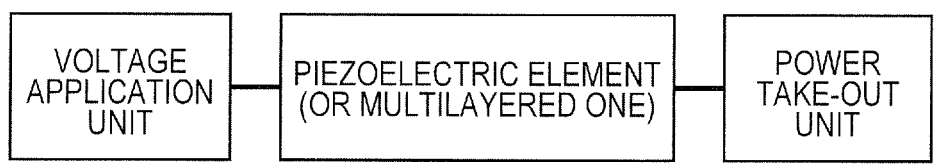
FIGS. 16A, 16B and 16C are schematic illustrations of an embodiment of piezoelectric device according to the present invention.
Figure 16B:
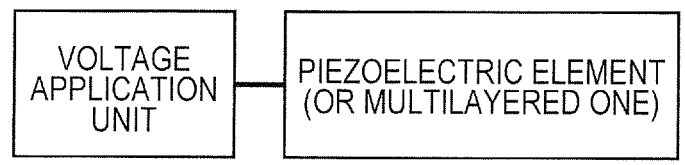
Figure 16C:
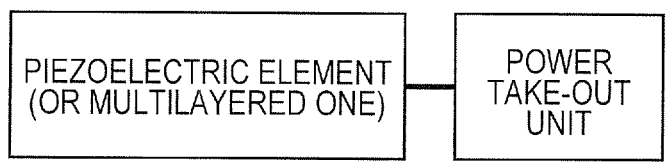

A piezoelectric ceramic according to the present invention can find applications in the field of piezoelectric devices of various devices including ultrasonic wave vibrators, piezoelectric actuators, piezoelectric sensors, ferroelectric random access memories and electric generators in addition to liquid ejection heads and motors. As illustrated in FIGS. 16A to 16C, a piezoelectric device according to the present invention includes a piezoelectric element or a laminated piezoelectric element according to the present invention and at least either a voltage application unit or a power take-out unit for the piezoelectric element or the laminated piezoelectric element. The expression of "power take-out" as used herein refers to an action of collecting electric energy or an action of receiving an electric signal.

EXAMPLES

Now, the present invention will be described more specifically by way of examples. However, the present invention is by no means limited by the examples that will be described below.

Example 1

(Preparation of Starting Materials of Piezoelectric Ceramic)

As starting materials, powdery barium carbonate ($BaCO_3$) (purity: 99.9% or higher) for Ba, powdery calcium carbonate ($CaCO_3$) (purity: 99.9% or higher) for Ca, powdery bismuth oxide ($Bi_2O_3$) (purity: 99.9% or higher) for Bi, powdery titanium oxide ($TiO_2$) (purity: 99.9% or higher) for Ti, powdery zirconium oxide ($ZrO_2$) (purity: 99.9% or higher) for Zr and powdery tri-manganese tetraoxide ($Mn_3O_4$) (purity: 99.5% or higher) for Mn were brought in.

The starting materials for Ba, Ca, Ti and Zr were weighed so as to make the added molar quantities of Ba and Ca becomes equal to the added molar quantities of Ti and Zr and they were heated in an electric furnace at 1,000° C. for 5 hours to produce calcined powder thereof for forming first crystal grains. The starting materials for Ba and Ti were weighed so as to make them good for the composition of second crystal grains listed in Table 1 and they were heated in an electric furnace at 1,000° C. for 5 hours to produce calcined powder thereof for forming second crystal grains. These two different types of calcined powders were mixed to make them represent the mixing ratio that is good for the composition of the piezoelectric ceramic shown in Table 1 and the starting materials of Bi and Mn were further added thereto. The mixture was agitated for a complete day to produce mixed calcined powders. The x, y and a values in Table 1 are respectively analyzed values of the Ca quantity, the Zr quantity and the ratio of the molar quantity of Ba and Ca to the molar quantity of Ti and Zr in the general formula $(Ba_{1-x}Ca_x)_a(Ti_{1-y}Zr_y)O_3$. In this example, the input ratio of the starting materials and the analyzed values obtained after the sintering agreed with each other.

Then PVA was added to the mixture of the calcined powders by 3 weight parts relative to 1 weight part of the mixture of the calcined powders and the mixture was atomized by means of a spray drier to produce granulated powder of the mixed calcined powder, to the surfaces of which the binder was made to adhere, as starting material of a piezoelectric ceramic.

(Preparation of Piezoelectric Ceramic)

A metal mold was filled with the granulated powder and pressurized by a press molding machine to produce a molded body. Then, the temperature of the molded body was gradually raised from 1,000° C. and a sintered body (polycrystalline piezoelectric ceramic) was prepared from the molded body in a baking condition of keeping the temperature of 1,300° C. for 5 hours.

(Method of Analyzing Piezoelectric Ceramic)

Metal or carbon film was laid on the surface of the piezoelectric ceramic that had been mirror-polished and an assay sample of thickness of 1 μm×width of 10 μm×length of 5 μm was cut out from the surface of the piezoelectric ceramic by means of a converged ion beam. Then, the assay sample was bonded to the observation grid of a transmission electron microscope (TEM) and a converged ion beam was irradiated in a direction that was parallel to the length direction of the sample to process the sample until it showed a thickness of 100 nm in an about 5 μm wide region.

Then, an electron beam was irradiated to the assay sample in the thickness direction of the sample and an electron beam diffraction image was obtained by means of selected area electron diffractometry. The metal oxides of the second crystal grains were identified by comparing the lattice plane spacing as determined from the electron beam diffraction image with known literature data.

As a result of a composition analysis involving STEM-EDX, it was found that there was no segregation of high density manganese on grain boundaries and the manganese content of the piezoelectric ceramic was substantially equal to the manganese content weighed at the time of preparing the starting materials of the piezoelectric ceramic. This fact suggests that manganese was efficiently taken into the first crystal grains.

Table 1 shows the composition of the piezoelectric ceramic as determined by selected area electron diffractometry and STEM-EDX as described above. Note that the Mn weight part (manganese weight part) and the Bi weight part (bismuth weight part) shown in Table 1 are the values obtained by converting the Mn quantity and the Bi quantity that were contained in the metal oxide as expressed by the general formula (1) and identified by the analysis into the metal weights relative to 100 weight parts of the metal oxide.

At the same time, the ratio of the number of moles of Ba and Ca, or A1, to the number of moles of Ti and Zr, or B1, of the first crystal grains that are held in contact with the second crystal grains, namely A1/B1, and the ratio of the number of moles of Ba and Ca, or A2, to the number of moles of Ti and Zr, or B2, of the first crystal grains that are not held in contact with the second crystal grains, namely A2/B2, were also evaluated. As a result, it was found that A1/B1 was 1.000 and A2/B2 was also 1.000. In other words, A1/B1 and A2/B2 showed a relationship of being equal to each other.

The average circle equivalent diameter of the crystal grains was determined by analyzing the image for observation obtained by means of a polarization microscope or a scanning electron microscope (SEM), using image processing software. The relative density was determined by calculations on the basis of the density measured by means of the Archimedian method.

The ratio (area %) that the second crystal grains took relative to the total area of the surfaces or the cross sections was determined by a SEM observation of the surface or a cross section of the piezoelectric ceramic. More specifically, the total area of the second crystal grains in the observed visual field was determined by binarization image processing on the basis of a difference in contrast between SEM images of the first and second crystal grains and then the ratio (area %) of the area that the second crystal grains took relative to the area of the observed visual field was determined.

Table 1 shows the results of measurements of the average circle equivalent diameter and the relative density of the first crystal grains.

(Preparation of Piezoelectric Element)

The obtained piezoelectric ceramic was polished until it showed a thickness of 0.5 mm and subsequently electrodes were formed on the front and back surfaces of the piezoelectric ceramic by means of DC sputtering. More specifically, after forming a 30 nm-thick titanium film layer as adhesion layer, a 400 nm-thick gold film layer was formed for each of the electrodes. The piezoelectric ceramic having the electrodes was then cut to produce a piezoelectric element of 10 mm×2.5 mm×0.5 mm as illustrated in FIG. 1.

The element was placed on a hot plate representing a surface temperature of between 110° C. and 140° C. and a DC voltage was applied to the electrodes formed on the opposite surfaces of the piezoelectric element for 30 minutes so as to produce an electric field intensity of 1.0 kV/mm. Thereafter, a polarization process of allowing the element to cool down to the room temperature was executed, while keeping on applying the voltage. The part of the piezoelectric ceramic sandwiched between the electrodes had residual polarization in the direction perpendicular to the electrodes.

(Evaluation of Mechanical Quality Factor and Piezoelectric Constant)

The piezoelectric element was arranged in a thermostat tank where the internal atmosphere was adjusted to 0° C. and the resonance frequency and the anti-resonance frequency of the piezoelectric element were measured by means of a commercially available impedance analyzer. Then, the mechanical quality factor and the piezoelectric constant ($d_{31}$) of the piezoelectric element of this example were determined by computations from the results of the measurement on the basis of the related standard of the Japan Electronics and Information Technology Industries Association (JETTA EM-4501).

Table 1 shows the results of the measurement of the mechanical quality factor at 0° C. and the piezoelectric constant ($d_{31}$) at 0° C. of the piezoelectric element.

Example 2 Through Example 60

For each of the examples, the starting materials were weighed as in Example 1 and a piezoelectric ceramic containing second crystal grains as listed in Table 1 was prepared. As a result of measuring A1/B1 and A2/B2 of each of the examples by the analysis method similar to the one employed for Example 1, it was found that A1/E1 was equal to A2/B2 in Examples 2, 7 and 8 but Examples 3 through 6 and 9 through 60 showed a relationship of A1/B1>A2/B2. Subsequently, a piezoelectric element was prepared in each of the examples by following the preparation procedures same as those of Example 1. Table 1 shows the measurement results obtained for the average circle equivalent diameter of the first crystal grains, the relative density, the mechanical quality factor at 0° C. and the piezoelectric constant ($d_{31}$) at 0° C. for each of the examples.

Example 61 Through Example 102

For each of the examples, the starting materials were weighed as in Example 1 and a piezoelectric ceramic containing second crystal grains as listed in Table 2 and also a piezoelectric element including the piezoelectric ceramic were prepared. Also for each of the examples, the ratio of the number of moles of Ba and Ca as represented by A3 to the number of moles of Ti and Zr as represented by B3, or A3/B3, of the first crystal grains that are held in contact with the second crystal grains and also the ratio of the number of moles of Ba and Ca as represented by A4 to the number of moles of Ti and Zr as represented by B4, or A4/B4 were determined. As a result of measurements, it was found that A3/B3 was equal to A4/B4 in Examples 61, 62, 67 and 68 but Examples 63 through 66 and 69 through 102 showed a relationship of A3/B3<A4/B4. Table 2 shows the measurement results obtained for the average circle equivalent diameter of the first crystal grains, the relative density, the mechanical quality factor at 0° C. and the piezoelectric constant ($d_{31}$) at 0° C. for each of the examples.

Example 103

(Laminated Piezoelectric Element Prepared by Using Piezoelectric Ceramic of Example 1)

Powdery barium carbonate ($BaCO_3$) (purity: 99.9% or higher), powder calcium carbonate ($CaCO_3$) (purity: 99.9% or higher), powdery bismuth oxide ($Bi_2O_3$) (purity: 99.9% or higher), powdery titanium oxide ($TiO_2$) (purity: 99.9% or higher), powdery zirconium oxide ($ZrO_2$) (purity: 99.9% or higher) and powdery tri-manganese tetraoxide ($Mn_3O_4$) (purity: 99.5% or higher) were brought in and calcined powder for producing first crystal grains and calcined powder for producing second crystal grains were prepared so as to produce a piezoelectric ceramic like the one described above for Example 1.

The calcined powders were weighed and mixed in a ball mill overnight to obtain mixed powder for preparing piezoelectric ceramics.

Note, however, in this example, a glass auxiliary that contained Si and B (in the form of $SiO_2$ by 30 to 50 weight % and in the form of $B_2O_3$ by 21.1 weight %) was added to the above mixture by 0.1 weight parts. Then, PVB was added to the obtained mixture powder and mixed well. Subsequently, a sheet was formed from the mixture by means of a doctor blade technique. The obtained sheet was a 50 μm-thick green sheet.

Electroconductive paste for internal electrodes was applied to the green sheet by printing. Alloy paste containing Ag by 60% and Pd by 40% was used for the electroconductive paste. In this way, a total of 9 green sheets carrying the electroconductive paste applied to it were prepared and laid one on the other to produce a laminated body. The laminated body was then baked at 1,2000° C. for 5 hours to obtain a sintered body. After cutting the sintered body to 100 mm×2.5 mm, the lateral surfaces thereof were polished and a pair of external electrodes (including a first electrode and a second electrode) was formed by Au sputtering for the purpose of alternately short-circuiting the internal electrodes. In this way, a laminated piezoelectric element as illustrated in FIG. 2B was prepared.

When the internal electrodes of the obtained laminated piezoelectric element were observed, it was found that Ag—Pd that was the electrode material and piezoelectric ceramics had alternately been formed.

Prior to evaluation of the piezoelectric properties of the laminated piezoelectric element, the sample was subjected to a polarization process. More specifically, the sample was heated to 100° C. in an oil bath and a voltage of 1 kV/mm was applied for 30 minutes between the first electrode and the second electrode. Then, the sample was cooled to the room temperature, while keeping on applying the voltage.

The obtained laminated piezoelectric element was evaluated for the piezoelectric properties thereof to find that it showed a satisfactory level of insulation and that piezoelectric characteristics equivalent to those of the piezoelectric ceramic of Example 1 could be obtained for it.

Example 104

(Laminated piezoelectric element having internal electrodes of Ag and Pd representing a weight ratio of not less than 0.25 and not more than 4.00 obtained by using piezoelectric ceramics similar to that of Example 1)

A laminated piezoelectric element was prepared by using electroconductive paste formed so as to make it represent the ratio M1/M2 of the content by weight of Ag, or M1, and the content by weight of Pd, or M2, equal to 0.25. The obtained piezoelectric element had a satisfactory level of insulation and excellent piezoelectric characteristics equivalent to those of the piezoelectric ceramic of Example 1.

Example 105

(Laminated Piezoelectric Element Having Internal Electrodes of Ni or Cu and Obtained by Using Piezoelectric Ceramics Similar to that of Example 1)

A powdery mixture was prepared by means of a technique similar to the one used in Example 103. The obtained powdery mixture was calcined by means of a rotary kiln at 1,000° C. for 3 hours in the atmosphere, while rotating the kiln. Calcined powder was obtained in this way. Then, the obtained calcined powder was cracked by means of a ball mill. PVD was added to the obtained cracked powder and mixed. Subsequently, a 50 μm-thick green sheet of the mixture was formed by means of a doctor blade technique. Electroconductive paste for forming internal electrodes was applied to the green sheet by printing. Ni paste was used as electroconductive paste. In this way, a total of nine green sheets to which electroconductive paste had been applied were prepared and laid one on the other and the laminated body was subjected to a thermal press fitting process.

The laminated body that had been subjected to a thermal press fitting process was baked in a tubular furnace. The baking operation was conducted in the atmosphere until it got to 300° C. and the baked laminated body was debindered. Subsequently, the atmosphere was switched to a reducing atmosphere ($H_2:N_2=2:98$, oxygen concentration $2 \times 10^6$ Pa) and the baking temperature was held to 1,200° C. for 5 hours. In the temperature falling process, the oxygen concentration was switched to 30 Pa at 1,000° C. and lower temperatures until the laminated body was cooled to the room temperature.

After cutting the sintered body to 10 mm×2.5 mm, the lateral surfaces thereof were polished and a pair of external electrodes (including a first electrode and a second electrode) was formed by Au sputtering for the purpose of alternately short-circuiting the internal electrodes. In this way, a laminated piezoelectric element as illustrated in FIG. 2B was prepared.

When the internal electrodes of the obtained laminated piezoelectric element were observed, it was found that Ni that was the electrode material and piezoelectric ceramics had alternately been formed. An electric field of 1 kV/mm was applied for 30 minutes to the obtained laminated piezoelectric element in an oil bath that was held to 100° C. for a polarization process. The obtained laminated piezoelectric element was evaluated for the piezoelectric properties thereof to find that it showed a satisfactory level of insulation and that piezoelectric characteristics equivalent to those of the piezoelectric ceramic of Example 1 could be obtained for it.

Example 106

(Liquid Ejection Head Including Piezoelectric Ceramic of Example 1)

A liquid ejection head as illustrated in FIGS. 3A and 3B was prepared by using a piezoelectric ceramic same as that of Example 1. It was confirmed that the liquid ejection head ejected ink according to the input electric signal applied to it.

Example 107

(Ejection Device Having Liquid Ejection Head Including Piezoelectric Ceramic of Example 1)

A liquid ejection device 881 as illustrated in FIG. 4 was prepared by using the liquid ejection head of Example 106. It was confirmed that the liquid ejection head ejected ink onto a transfer medium according to the input electric signal applied to it.

Example 108

(Ultrasonic Motor Including Piezoelectric Ceramic of Example 1)

An ultrasonic motor as illustrated in FIG. 6A was prepared by using a piezoelectric ceramic same as that of Example 1. It was confirmed that the motor is driven to rotate and behave according to the alternating current voltages applied to it.

Example 109

An ultrasonic motor as illustrated in FIG. 6B was prepared by using a piezoelectric ceramic same as that of Example 1. It was confirmed that the motor was driven to rotate and behaved according to the alternating current voltages applied to it.

Example 110

(Optical Instrument Including Ultrasonic Motor Formed by Using Piezoelectric Ceramic of Example 1)

An optical instrument as illustrated in FIGS. 7A and 7B was prepared by using the ultrasonic motor of Example 108. It was confirmed that the optical instrument was driven for an automatic focusing operation according to the alternating current voltages applied to it.

Example 111

(Dust Removal Device Including Piezoelectric Ceramic of Example 1)

A dust removal device 310 as illustrated in FIGS. 9A and 9B was prepared by using a piezoelectric ceramic same as that of Example 1. Plastic-made beads were sprayed onto the surface of the vibrating plate 302 thereof and an alternating current voltage was applied to a piezoelectric element 330. It was confirmed that the beads had been removed from the vibrating plate 320.

Example 112

(Image Pickup Device Including Dust Removal Device Formed by Using Piezoelectric Ceramic of Example 1)

An image pickup device having an image pickup sensor (not illustrated) on the surface of the dust removal device 310 thereof as illustrated in FIG. 12 was prepared. The dust on the surface of the vibrating plate 320 is usually picked up into the image pickup sensor to degrade the picked-up image. However, as the dust removal device was operated, the dust was satisfactorily removed and a picked-up image that was free from any defect was obtained.

Example 113

(Electronic Instrument Formed by Using Piezoelectric Ceramic of Example 1)

An electronic instrument as illustrated in FIG. 14 was prepared by using the laminated piezoelectric element of Example 103. It was confirmed that the electronic instrument is provided with a well-operating speaker function according to the alternating current voltage applied to it.

Comparative Examples 1 Through 29

The starting materials were weighed to make them represent the compositions of first crystal grains shown in Table 3 and the steps same as those of Example 1 were followed to prepare the piezoelectric ceramics and the piezoelectric elements of Comparative Examples 1 through 29.

The piezoelectric ceramics were analyzed by the analysis method same as that of Example 1 to determine the ratio of the number of moles of Ba and Ca as represented by —A to the number of moles of Ti and Zr as represented by B, or A/B. Table 3 shows the average circle equivalent diameter of the first crystal grains, the relative density, the mechanical quality factor at 0° C. and the piezoelectric constant ($d_{31}$) at 0° C. of each of the comparative examples.

As a result of evaluation using the analysis method same as that of Example 1, it was found that the Mn quantity (quantity of manganese) contained in the crystal grains was small when compared with the weighed Mn quantity because manganese had deposited on grain boundaries in each of the comparative examples.

Thus, it was confirmed that the manganese concentration in the crystal grains was low and the mechanical quality factor was also low in each of the comparative examples if compared with the examples of Tables 1 and 2. In other words, it was confirmed that, by adopting a structure of piezoelectric ceramic having second crystal grains, the deposition of manganese to the outside of the first crystal grains can effectively be suppressed and the mechanical quality factor was improved.

TABLE 1

| EXAMPLE NO. | x | y | a | Mn [wt. part] | Bi [wt. part] | A1/B1 | A2/B2 | formula of second grain | av. circ. eq. diameter of first grain [μm] | proportion of second grain [area %] | relative density [%] | mechanical quality factor at 0° C. | piezoelectric constant d31 at 0° C. [pm/V] | Mn contained in first grain [wt %] |
|---|---|---|---|---|---|---|---|---|---|---|---|---|---|---|
| EX. 1 | 0.15 | 0.065 | 1.000 | 0.150 | 0.250 | 1.000 | 1.000 | $BaTi_2O_5$ | 3.0 | 0.07 | 97 | 1300 | 130 | 0.15 |
| EX. 2 | 0.15 | 0.065 | 1.000 | 0.250 | 0.250 | 1.000 | 1.000 | $BaTi_2O_5$ | 3.0 | 0.07 | 97 | 1560 | 124 | 0.25 |
| EX. 3 | 0.15 | 0.065 | 1.000 | 0.160 | 0.240 | 1.020 | 1.000 | $BaTi_2O_5$ | 3.0 | 0.07 | 97 | 1300 | 130 | 0.16 |
| EX. 4 | 0.15 | 0.065 | 1.000 | 0.240 | 0.240 | 1.020 | 1.000 | $BaTi_2O_5$ | 3.0 | 0.07 | 97 | 1250 | 130 | 0.24 |
| EX. 5 | 0.15 | 0.065 | 0.999 | 0.150 | 0.000 | 1.020 | 0.999 | $BaTi_2O_5$ | 3.0 | 0.07 | 97 | 1430 | 117 | 0.15 |
| EX. 6 | 0.15 | 0.065 | 0.999 | 0.250 | 0.000 | 1.020 | 0.999 | $BaTi_2O_5$ | 3.0 | 0.07 | 97 | 1085 | 115 | 0.25 |
| EX. 7 | 0.15 | 0.065 | 0.999 | 0.160 | 0.000 | 0.999 | 0.999 | $BaTi_2O_5$ | 3.0 | 0.07 | 97 | 1430 | 117 | 0.16 |
| EX. 8 | 0.15 | 0.065 | 0.999 | 0.240 | 0.000 | 0.999 | 0.999 | $BaTi_2O_5$ | 3.0 | 0.07 | 97 | 1085 | 115 | 0.24 |
| EX. 9 | 0.19 | 0.083 | 0.995 | 0.150 | 0.100 | 1.020 | 0.995 | $BaTi_2O_5$ | 3.0 | 0.07 | 97 | 1078 | 104 | 0.15 |
| EX. 10 | 0.09 | 0.065 | 1.000 | 0.150 | 0.250 | 1.020 | 1.000 | $BaTi_2O_5$ | 3.0 | 0.07 | 97 | 1068 | 143 | 0.15 |
| EX. 11 | 0.30 | 0.065 | 1.000 | 0.150 | 0.250 | 1.020 | 1.000 | $BaTi_2O_5$ | 3.0 | 0.07 | 97 | 1068 | 104 | 0.15 |
| EX. 12 | 0.15 | 0.025 | 1.000 | 0.150 | 0.250 | 1.020 | 1.000 | $BaTi_2O_5$ | 3.0 | 0.07 | 97 | 1033 | 101 | 0.15 |
| EX. 13 | 0.15 | 0.085 | 1.000 | 0.150 | 0.250 | 1.020 | 1.000 | $BaTi_2O_5$ | 3.0 | 0.07 | 97 | 1051 | 143 | 0.15 |
| EX. 14 | 0.15 | 0.065 | 0.986 | 0.150 | 0.250 | 1.006 | 0.986 | $BaTi_2O_5$ | 3.0 | 0.07 | 97 | 1177 | 111 | 0.15 |
| EX. 15 | 0.15 | 0.065 | 1.020 | 0.150 | 0.250 | 1.040 | 1.020 | $BaTi_2O_5$ | 3.0 | 0.07 | 97 | 1089 | 137 | 0.15 |
| EX. 16 | 0.15 | 0.065 | 1.000 | 0.360 | 0.250 | 1.020 | 1.000 | $BaTi_2O_5$ | 3.0 | 0.07 | 97 | 1181 | 124 | 0.36 |
| EX. 17 | 0.15 | 0.065 | 1.000 | 0.040 | 0.250 | 1.020 | 1.000 | $BaTi_2O_5$ | 3.0 | 0.07 | 97 | 1187 | 130 | 0.04 |
| EX. 18 | 0.15 | 0.065 | 1.000 | 0.150 | 0.850 | 1.020 | 1.000 | $BaTi_2O_5$ | 3.0 | 0.07 | 97 | 1079 | 129 | 0.15 |
| EX. 19 | 0.15 | 0.065 | 1.000 | 0.150 | 0.042 | 1.020 | 1.000 | $BaTi_2O_5$ | 3.0 | 0.07 | 97 | 1065 | 122 | 0.15 |
| EX. 20 | 0.15 | 0.065 | 1.000 | 0.150 | 0.250 | 1.020 | 1.000 | $BaTi_2O_5$ | 0.6 | 0.07 | 97 | 1164 | 120 | 0.15 |
| EX. 21 | 0.15 | 0.065 | 1.000 | 0.150 | 0.250 | 1.020 | 1.000 | $BaTi_2O_5$ | 10.0 | 0.07 | 97 | 1148 | 126 | 0.15 |
| EX. 22 | 0.15 | 0.065 | 1.000 | 0.150 | 0.250 | 1.020 | 1.000 | $BaTi_2O_5$ | 3.0 | 0.05 | 97 | 1138 | 129 | 0.15 |
| EX. 23 | 0.15 | 0.065 | 1.000 | 0.150 | 0.250 | 1.020 | 1.000 | $BaTi_2O_5$ | 3.0 | 1.00 | 97 | 1155 | 130 | 0.15 |
| EX. 24 | 0.15 | 0.065 | 1.000 | 0.150 | 0.250 | 1.020 | 1.000 | $BaTi_2O_5$ | 3.0 | 0.07 | 93 | 1134 | 127 | 0.15 |
| EX. 25 | 0.15 | 0.065 | 1.000 | 0.150 | 0.250 | 1.020 | 1.000 | $BaTi_2O_5$ | 3.0 | 0.07 | 100 | 1124 | 130 | 0.15 |
| EX. 26 | 0.15 | 0.065 | 1.000 | 0.150 | 0.250 | 1.020 | 1.000 | $BaTi_4O_9$ | 3.0 | 0.07 | 97 | 1061 | 131 | 0.15 |
| EX. 27 | 0.15 | 0.065 | 1.000 | 0.150 | 0.250 | 1.020 | 1.000 | $BaTi_5O_{11}$ | 3.0 | 0.07 | 97 | 1024 | 129 | 0.15 |
| EX. 28 | 0.15 | 0.065 | 1.000 | 0.150 | 0.250 | 1.020 | 1.000 | $BaTi_6O_{13}$ | 3.0 | 0.07 | 97 | 1053 | 131 | 0.15 |
| EX. 29 | 0.15 | 0.065 | 1.000 | 0.150 | 0.250 | 1.020 | 1.000 | $BaTi_7O_{14}$ | 3.0 | 0.07 | 97 | 1006 | 127 | 0.15 |
| EX. 30 | 0.15 | 0.065 | 1.000 | 0.150 | 0.250 | 1.020 | 1.000 | $BaTi_8O_{16}$ | 3.0 | 0.07 | 97 | 1100 | 129 | 0.15 |
| EX. 31 | 0.15 | 0.065 | 1.000 | 0.150 | 0.250 | 1.020 | 1.000 | $Ba_2Ti_5O_{12}$ | 3.0 | 0.07 | 97 | 1049 | 128 | 0.15 |
| EX. 32 | 0.15 | 0.065 | 1.000 | 0.150 | 0.250 | 1.020 | 1.000 | $Ba_2Ti_8O_{13}$ | 3.0 | 0.07 | 97 | 1022 | 128 | 0.15 |
| EX. 33 | 0.15 | 0.065 | 1.000 | 0.150 | 0.250 | 1.020 | 1.000 | $Ba_2Ti_9O_{20}$ | 3.0 | 0.07 | 97 | 1086 | 133 | 0.15 |
| EX. 34 | 0.15 | 0.065 | 1.000 | 0.150 | 0.250 | 1.020 | 1.000 | $Ba_4Ti_{11}O_{26}$ | 3.0 | 0.07 | 97 | 1008 | 130 | 0.15 |
| EX. 35 | 0.15 | 0.065 | 1.000 | 0.150 | 0.250 | 1.020 | 1.000 | $Ba_4Ti_{12}O_{27}$ | 3.0 | 0.07 | 97 | 1135 | 132 | 0.15 |
| EX. 36 | 0.15 | 0.065 | 1.000 | 0.150 | 0.250 | 1.020 | 1.000 | $Ba_4Ti_{13}O_{30}$ | 3.0 | 0.07 | 97 | 1114 | 127 | 0.15 |
| EX. 37 | 0.15 | 0.065 | 1.000 | 0.150 | 0.250 | 1.020 | 1.000 | $Ba_6Ti_{17}O_{40}$ | 3.0 | 0.07 | 97 | 1011 | 127 | 0.15 |
| EX. 38 | 0.15 | 0.065 | 1.000 | 0.150 | 0.250 | 1.020 | 1.000 | $CaTi_2O_4$ | 3.0 | 0.07 | 97 | 1009 | 129 | 0.15 |
| EX. 39 | 0.15 | 0.065 | 1.000 | 0.150 | 0.250 | 1.020 | 1.000 | $CaTi_2O_5$ | 3.0 | 0.07 | 97 | 1036 | 135 | 0.15 |
| EX. 40 | 0.15 | 0.065 | 1.000 | 0.150 | 0.250 | 1.020 | 1.000 | $CaTi_4O_9$ | 3.0 | 0.07 | 97 | 1135 | 134 | 0.15 |
| EX. 41 | 0.15 | 0.065 | 1.000 | 0.150 | 0.250 | 1.020 | 1.000 | $Ca_2Ti_5O_{12}$ | 3.0 | 0.07 | 97 | 1115 | 126 | 0.15 |
| EX. 42 | 0.15 | 0.065 | 1.000 | 0.150 | 0.250 | 1.020 | 1.000 | $CaZr_4O_9$ | 3.0 | 0.07 | 97 | 1059 | 129 | 0.15 |
| EX. 43 | 0.15 | 0.065 | 1.000 | 0.150 | 0.250 | 1.020 | 1.000 | $Ca_2Zr_7O_{16}$ | 3.0 | 0.07 | 97 | 1055 | 133 | 0.15 |
| EX. 44 | 0.15 | 0.065 | 1.000 | 0.150 | 0.250 | 1.020 | 1.000 | $Ca_6Zr_{19}O_{44}$ | 3.0 | 0.07 | 97 | 1091 | 131 | 0.15 |
| EX. 45 | 0.15 | 0.066 | 1.000 | 0.150 | 0.250 | 1.020 | 1.000 | $CaZrTi_2O_7$ | 3.0 | 0.07 | 97 | 1171 | 134 | 0.15 |
| EX. 46 | 0.15 | 0.065 | 1.000 | 0.150 | 0.250 | 1.020 | 1.000 | $Ca_2Zr_5Ti_2O_{16}$ | 3.0 | 0.07 | 97 | 1132 | 126 | 0.15 |
| EX. 47 | 0.10 | 0.065 | 1.000 | 0.150 | 0.250 | 1.020 | 1.000 | $BaTi_2O_5$ | 3.0 | 0.07 | 97 | 1019 | 128 | 0.15 |
| EX. 48 | 0.20 | 0.065 | 1.000 | 0.150 | 0.250 | 1.020 | 1.000 | $BaTi_2O_5$ | 3.0 | 0.07 | 97 | 1090 | 127 | 0.15 |
| EX. 49 | 0.12 | 0.065 | 1.000 | 0.150 | 0.250 | 1.020 | 1.000 | $BaTi_2O_5$ | 3.0 | 0.07 | 97 | 1139 | 135 | 0.15 |
| EX. 50 | 0.18 | 0.065 | 1.000 | 0.150 | 0.250 | 1.020 | 1.000 | $BaTi_2O_5$ | 3.0 | 0.07 | 97 | 1021 | 130 | 0.15 |
| EX. 51 | 0.15 | 0.040 | 1.000 | 0.150 | 0.250 | 1.020 | 1.000 | $BaTi_2O_5$ | 3.0 | 0.07 | 97 | 1059 | 133 | 0.15 |
| EX. 52 | 0.15 | 0.083 | 1.000 | 0.150 | 0.250 | 1.020 | 1.000 | $BaTi_2O_5$ | 3.0 | 0.07 | 97 | 1161 | 132 | 0.15 |
| EX. 53 | 0.15 | 0.050 | 1.000 | 0.150 | 0.250 | 1.020 | 1.000 | $BaTi_2O_5$ | 3.0 | 0.07 | 97 | 1149 | 129 | 0.15 |
| EX. 54 | 0.15 | 0.080 | 1.000 | 0.150 | 0.250 | 1.020 | 1.000 | $BaTi_2O_5$ | 3.0 | 0.07 | 97 | 1141 | 135 | 0.15 |
| EX. 55 | 0.15 | 0.065 | 0.993 | 0.150 | 0.250 | 1.020 | 0.993 | $BaTi_2O_5$ | 3.0 | 0.07 | 97 | 1023 | 134 | 0.15 |
| EX. 56 | 0.15 | 0.065 | 1.003 | 0.150 | 0.250 | 1.020 | 1.003 | $BaTi_2O_5$ | 3.0 | 0.07 | 97 | 1038 | 126 | 0.15 |
| EX. 57 | 0.15 | 0.065 | 0.996 | 0.150 | 0.250 | 1.020 | 0.996 | $BaTi_2O_5$ | 3.0 | 0.07 | 97 | 1017 | 131 | 0.15 |
| EX. 58 | 0.15 | 0.065 | 1.002 | 0.150 | 0.250 | 1.020 | 1.002 | $BaTi_2O_5$ | 3.0 | 0.07 | 97 | 1191 | 132 | 0.15 |
| EX. 59 | 0.15 | 0.065 | 1.000 | 0.150 | 0.100 | 1.020 | 1.000 | $BaTi_2O_5$ | 3.0 | 0.07 | 97 | 1122 | 126 | 0.15 |
| EX. 60 | 0.15 | 0.065 | 1.000 | 0.150 | 0.400 | 1.020 | 1.000 | $BaTi_2O_5$ | 3.0 | 0.07 | 97 | 1097 | 133 | 0.15 |

TABLE 2

| EXAMPLE NO. | x | y | a | Mn [wt. part] | Bi [wt. part] | A3/B3 | A4/B4 | formula of second grain | av. circ. eq. diameter of first grain [μm] | proportion of second grain [area %] | relative density [%] | mechanical quailty factor at 0° C. | piezoelectric constant $d_{31}$ at 0° C. [pm/V] | Mn contained in first grain [wt %] |
|---|---|---|---|---|---|---|---|---|---|---|---|---|---|---|
| EX. 61 | 0.15 | 0.065 | 1.000 | 0.150 | 0.250 | 1.000 | 1.000 | $Ba_2TiO_4$ | 3.0 | 0.07 | 97 | 1261 | 126 | 0.15 |
| EX. 62 | 0.09 | 0.065 | 1.000 | 0.150 | 0.250 | 1.000 | 1.000 | $Ba_2TiO_4$ | 3.0 | 0.07 | 97 | 1046 | 140 | 0.15 |
| EX. 63 | 0.15 | 0.065 | 1.000 | 0.160 | 0.246 | 0.995 | 1.000 | $Ba_2TiO_4$ | 3.0 | 0.07 | 97 | 1261 | 126 | 0.16 |
| EX. 64 | 0.09 | 0.065 | 1.000 | 0.160 | 0.246 | 0.995 | 1.000 | $Ba_2TiO_4$ | 3.0 | 0.07 | 97 | 1013 | 99 | 0.16 |
| EX. 65 | 0.15 | 0.065 | 1.000 | 0.150 | 0.000 | 0.999 | 1.000 | $Ba_2TiO_4$ | 3.0 | 0.07 | 97 | 1387 | 113 | 0.15 |
| EX. 66 | 0.15 | 0.065 | 1.000 | 0.250 | 0.000 | 0.999 | 1.000 | $Ba_2TiO_4$ | 3.0 | 0.07 | 97 | 1154 | 108 | 0.25 |
| EX. 67 | 0.15 | 0.065 | 1.000 | 0.160 | 0.000 | 1.000 | 1.000 | $Ba_2TiO_4$ | 3.0 | 0.07 | 97 | 1387 | 113 | 0.16 |
| EX. 68 | 0.15 | 0.065 | 1.000 | 0.240 | 0.000 | 1.000 | 1.000 | $Ba_2TiO_4$ | 3.0 | 0.07 | 97 | 1158 | 121 | 0.24 |
| EX. 69 | 0.30 | 0.065 | 1.000 | 0.150 | 0.250 | 0.995 | 1.000 | $Ba_2TiO_4$ | 3.0 | 0.07 | 97 | 1047 | 102 | 0.15 |
| EX. 70 | 0.15 | 0.025 | 1.000 | 0.150 | 0.250 | 0.995 | 1.000 | $Ba_2TiO_4$ | 3.0 | 0.07 | 97 | 1013 | 99 | 0.15 |
| EX. 71 | 0.15 | 0.085 | 1.000 | 0.150 | 0.250 | 0.995 | 1.000 | $Ba_2TiO_4$ | 3.0 | 0.07 | 97 | 1030 | 140 | 0.15 |
| EX. 72 | 0.15 | 0.065 | 0.986 | 0.150 | 0.250 | 0.981 | 0.986 | $Ba_2TiO_4$ | 3.0 | 0.07 | 97 | 1154 | 108 | 0.15 |
| EX. 73 | 0.15 | 0.065 | 1.020 | 0.150 | 0.250 | 1.015 | 1.020 | $Ba_2TiO_4$ | 3.0 | 0.07 | 97 | 1067 | 134 | 0.15 |
| EX. 74 | 0.15 | 0.065 | 1.000 | 0.360 | 0.250 | 0.995 | 1.000 | $Ba_2TiO_4$ | 3.0 | 0.07 | 97 | 1158 | 121 | 0.36 |
| EX. 75 | 0.15 | 0.065 | 1.000 | 0.040 | 0.250 | 0.995 | 1.000 | $Ba_2TiO_4$ | 3.0 | 0.07 | 97 | 1164 | 127 | 0.04 |
| EX. 76 | 0.15 | 0.065 | 1.000 | 0.150 | 0.850 | 0.995 | 1.000 | $Ba_2TiO_4$ | 3.0 | 0.07 | 97 | 1057 | 126 | 0.15 |
| EX. 77 | 0.15 | 0.065 | 1.000 | 0.150 | 0.042 | 0.995 | 1.000 | $Ba_2TiO_4$ | 3.0 | 0.07 | 97 | 1044 | 120 | 0.15 |
| EX. 78 | 0.15 | 0.065 | 1.000 | 0.150 | 0.250 | 0.995 | 1.000 | $Ba_2TiO_4$ | 0.5 | 0.07 | 97 | 1041 | 122 | 0.15 |
| EX. 79 | 0.15 | 0.065 | 1.000 | 0.150 | 0.250 | 0.995 | 1.000 | $Ba_2TiO_4$ | 10.0 | 0.07 | 97 | 1156 | 128 | 0.15 |
| EX. 80 | 0.15 | 0.065 | 1.000 | 0.150 | 0.250 | 0.995 | 1.000 | $Ba_2TiO_4$ | 3.0 | 0.05 | 97 | 1010 | 125 | 0.15 |
| EX. 81 | 0.15 | 0.065 | 1.000 | 0.150 | 0.250 | 0.995 | 1.000 | $Ba_2TiO_4$ | 3.0 | 1.00 | 97 | 1066 | 127 | 0.15 |
| EX. 82 | 0.15 | 0.065 | 1.000 | 0.150 | 0.250 | 0.995 | 1.000 | $Ba_2TiO_4$ | 3.0 | 0.07 | 93 | 1114 | 125 | 0.15 |
| EX. 83 | 0.15 | 0.065 | 1.000 | 0.150 | 0.250 | 0.995 | 1.000 | $Ba_2TiO_4$ | 3.0 | 0.07 | 100 | 1130 | 127 | 0.15 |
| EX. 84 | 0.15 | 0.065 | 1.000 | 0.150 | 0.250 | 0.990 | 0.995 | $Ba_2TiO_4$ | 3.0 | 0.07 | 97 | 1084 | 129 | 0.15 |
| EX. 85 | 0.15 | 0.065 | 1.000 | 0.150 | 0.250 | 0.990 | 0.995 | $Ca_3Ti_2O_7$ | 3.0 | 0.07 | 97 | 1067 | 127 | 0.15 |
| EX. 86 | 0.15 | 0.065 | 1.000 | 0.150 | 0.250 | 0.990 | 0.995 | $Ba_2ZrO_4$ | 3.0 | 0.07 | 97 | 1143 | 126 | 0.15 |
| EX. 87 | 0.15 | 0.065 | 1.000 | 0.150 | 0.250 | 0.990 | 0.995 | $Ba_3Zr_2O_7$ | 3.0 | 0.07 | 97 | 1146 | 122 | 0.15 |
| EX. 88 | 0.15 | 0.065 | 1.000 | 0.150 | 0.250 | 0.990 | 0.995 | $BaCaTiO_4$ | 3.0 | 0.07 | 97 | 1155 | 121 | 0.15 |
| EX. 89 | 0.15 | 0.065 | 1.000 | 0.150 | 0.250 | 0.990 | 0.995 | $Ba_3Ca_2Ti_2O_9$ | 3.0 | 0.07 | 97 | 1036 | 128 | 0.15 |
| EX. 90 | 0.15 | 0.065 | 1.000 | 0.150 | 0.250 | 0.990 | 0.995 | $Ca_4Ti_3O_{10}$ | 3.0 | 0.07 | 97 | 1103 | 125 | 0.15 |
| EX. 91 | 0.10 | 0.065 | 1.000 | 0.150 | 0.250 | 0.990 | 0.995 | $Ba_2TiO_4$ | 3.0 | 0.07 | 97 | 1185 | 127 | 0.15 |
| EX. 92 | 0.20 | 0.065 | 1.000 | 0.150 | 0.250 | 0.990 | 0.995 | $Ba_2TiO_4$ | 3.0 | 0.07 | 97 | 1039 | 121 | 0.15 |
| EX. 93 | 0.12 | 0.065 | 1.000 | 0.150 | 0.250 | 0.990 | 0.995 | $Ba_2TiO_4$ | 3.0 | 0.07 | 97 | 1113 | 128 | 0.15 |
| EX. 94 | 0.18 | 0.065 | 1.000 | 0.150 | 0.250 | 0.990 | 0.995 | $Ba_2TiO_4$ | 3.0 | 0.07 | 97 | 1170 | 127 | 0.15 |
| EX. 95 | 0.15 | 0.040 | 1.000 | 0.150 | 0.250 | 0.990 | 0.995 | $Ba_2TiO_4$ | 3.0 | 0.07 | 97 | 1052 | 129 | 0.15 |
| EX. 96 | 0.15 | 0.083 | 1.000 | 0.150 | 0.250 | 0.990 | 0.995 | $Ba_2TiO_4$ | 3.0 | 0.07 | 97 | 1053 | 125 | 0.15 |
| EX. 97 | 0.15 | 0.050 | 1.000 | 0.150 | 0.250 | 0.990 | 0.995 | $Ba_2TiO_4$ | 3.0 | 0.07 | 97 | 1186 | 125 | 0.15 |
| EX. 98 | 0.15 | 0.080 | 1.000 | 0.150 | 0.250 | 0.990 | 0.995 | $Ba_2TiO_4$ | 3.0 | 0.07 | 97 | 1098 | 123 | 0.15 |
| EX. 99 | 0.15 | 0.065 | 0.993 | 0.150 | 0.250 | 0.990 | 0.995 | $Ba_2TiO_4$ | 3.0 | 0.07 | 97 | 1148 | 125 | 0.15 |
| EX. 100 | 0.15 | 0.065 | 1.003 | 0.150 | 0.250 | 0.990 | 0.995 | $Ba_2TiO_4$ | 3.0 | 0.07 | 97 | 1001 | 122 | 0.15 |
| EX. 101 | 0.15 | 0.065 | 0.996 | 0.150 | 0.250 | 0.990 | 0.995 | $Ba_2TiO_4$ | 3.0 | 0.07 | 97 | 1135 | 125 | 0.15 |
| EX. 102 | 0.15 | 0.065 | 1.002 | 0.150 | 0.250 | 0.990 | 0.995 | $Ba_2TiO_4$ | 3.0 | 0.07 | 97 | 1106 | 123 | 0.15 |

TABLE 3

| COMPARISON EXAMPLE NO. | x | y | a | Mn [wt. part] | Bi [wt. part] | A/B | av. circ. eq. diameter of first grain [μm] | relative density [%] | mechanical quailty factor at 0° C. | piezoelectric constant $d_{31}$ at 0° C. [pm/V] | Mn contained in grain [wt %] |
|---|---|---|---|---|---|---|---|---|---|---|---|
| COMP. EX. 1 | 0.15 | 0.065 | 1.000 | 0.150 | 0.250 | 1.000 | 3.0 | 97 | 792 | 122 | 0.13 |
| COMP. EX. 2 | 0.15 | 0.065 | 1.000 | 0.250 | 0.250 | 1.000 | 3.0 | 97 | 817 | 114 | 0.13 |
| COMP. EX. 3 | 0.15 | 0.065 | 0.999 | 0.150 | 0.000 | 0.999 | 3.0 | 97 | 802 | 114 | 0.13 |
| COMP. EX. 4 | 0.15 | 0.065 | 0.999 | 0.250 | 0.000 | 0.999 | 3.0 | 97 | 758 | 105 | 0.13 |
| COMP. EX. 5 | 0.19 | 0.083 | 0.995 | 0.150 | 0.100 | 0.995 | 3.0 | 97 | 639 | 96 | 0.16 |
| COMP. EX. 6 | 0.09 | 0.065 | 1.000 | 0.150 | 0.250 | 1.000 | 3.0 | 97 | 846 | 137 | 0.08 |
| COMP. EX. 7 | 0.30 | 0.065 | 1.000 | 0.150 | 0.250 | 1.000 | 3.0 | 97 | 758 | 91 | 0.26 |
| COMP. EX. 8 | 0.15 | 0.025 | 1.000 | 0.150 | 0.250 | 1.000 | 3.0 | 97 | 742 | 90 | 0.13 |
| COMP. EX. 9 | 0.15 | 0.085 | 1.000 | 0.150 | 0.250 | 1.000 | 3.0 | 97 | 859 | 147 | 0.13 |
| COMP. EX. 10 | 0.15 | 0.065 | 0.986 | 0.150 | 0.250 | 0.986 | 3.0 | 97 | 759 | 102 | 0.13 |
| COMP. EX. 11 | 0.15 | 0.065 | 1.020 | 0.150 | 0.250 | 1.020 | 3.0 | 97 | 885 | 130 | 0.13 |
| COMP. EX. 12 | 0.15 | 0.065 | 1.000 | 0.360 | 0.250 | 1.000 | 3.0 | 97 | 735 | 120 | 0.13 |
| COMP. EX. 13 | 0.15 | 0.065 | 1.000 | 0.040 | 0.250 | 1.000 | 3.0 | 97 | 847 | 128 | 0.13 |
| COMP. EX. 14 | 0.15 | 0.065 | 1.000 | 0.150 | 0.850 | 1.000 | 3.0 | 97 | 755 | 124 | 0.13 |
| COMP. EX. 15 | 0.15 | 0.065 | 1.000 | 0.150 | 0.042 | 1.000 | 3.0 | 97 | 745 | 117 | 0.13 |
| COMP. EX. 16 | 0.15 | 0.065 | 1.000 | 0.150 | 0.250 | 1.000 | 0.5 | 97 | 842 | 135 | 0.12 |
| COMP. EX. 17 | 0.15 | 0.065 | 1.000 | 0.150 | 0.250 | 1.000 | 10.0 | 97 | 796 | 123 | 0.14 |
| COMP. EX. 18 | 0.15 | 0.065 | 1.000 | 0.150 | 0.250 | 1.000 | 3.0 | 93 | 876 | 120 | 0.12 |
| COMP. EX. 19 | 0.15 | 0.065 | 1.000 | 0.150 | 0.250 | 1.000 | 3.0 | 100 | 776 | 123 | 0.13 |
| COMP. EX. 20 | 0.08 | 0.065 | 1.000 | 0.150 | 0.250 | 1.000 | 3.0 | 97 | 795 | 83 | 0.07 |
| COMP. EX. 21 | 0.31 | 0.065 | 1.000 | 0.150 | 0.250 | 1.000 | 3.0 | 97 | 620 | 77 | 0.27 |

TABLE 3-continued

| COMPARISON EXAMPLE NO. | x | y | a | Mn [wt. part] | Bi [wt. part] | A/B | av. circ. eq. diameter of first grain [μm] | relative density [%] | mechanical quailty factor at 0° C. | piezoelectric constant $d_{31}$ at 0° C. [pm/V] | Mn contained in grain [wt %] |
|---|---|---|---|---|---|---|---|---|---|---|---|
| COMP. EX. 22 | 0.15 | 0.024 | 1.000 | 0.150 | 0.250 | 1.000 | 3.0 | 97 | 890 | 86 | 0.13 |
| COMP. EX. 23 | 0.15 | 0.086 | 1.000 | 0.150 | 0.250 | 1.000 | 3.0 | 97 | 704 | 86 | 0.13 |
| COMP. EX. 24 | 0.15 | 0.065 | 0.988 | 0.150 | 0.250 | 0.988 | 3.0 | 97 | 617 | 84 | 0.13 |
| COMP. EX. 25 | 0.15 | 0.065 | 1.033 | 0.150 | 0.250 | 1.033 | 3.0 | 97 | 630 | 80 | 0.13 |
| COMP. EX. 26 | 0.15 | 0.065 | 1.000 | 0.030 | 0.250 | 1.000 | 3.0 | 97 | 747 | 76 | 0.13 |
| COMP. EX. 27 | 0.15 | 0.065 | 1.000 | 0.037 | 0.250 | 1.000 | 3.0 | 97 | 853 | 84 | 0.13 |
| COMP. EX. 28 | 0.15 | 0.065 | 1.000 | 0.150 | 0.0410 | 1.000 | 3.0 | 97 | 846 | 74 | 0.13 |
| COMP. EX. 29 | 0.15 | 0.065 | 1.000 | 0.150 | 0.0851 | 1.000 | 3.0 | 97 | 830 | 84 | 0.13 |

INDUSTRIAL APPLICABILITY

A piezoelectric ceramic according to the present invention compatibly represents both an excellent piezoelectric constant and an excellent mechanical quality factor and is harmless to the environment because it contains neither lead nor alkali metals. Therefore, it can find applications in the field of piezoelectric devices such as liquid ejection heads, ultrasonic motors and dust removal devices. Furthermore, a piezoelectric ceramic according to the present invention can also find applications in the field optical instruments, image pickup devices and electronic instruments formed by using piezoelectric ceramics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of the Japanese Patent Application No. 2015-003198, filed Jan. 9, 2015, which is hereby incorporated by reference herein in its entirety.

What is claimed is:

1. A piezoelectric ceramic containing a metal oxide expressed by general formula (1) and Mn at 0.04 weight parts to 0.36 weight parts relative to 100 weight parts of the metal oxide in terms of metal;

the piezoelectric ceramic comprising a plurality of first crystal grains having a perovskite structure and a plurality of second crystal grains existing between the first crystal grains and having a crystal structure different from that of the first crystal grains;

the second crystal grains containing a metal oxide expressed by a general formula (2) or a general formula (4) as a principal ingredient:

$(Ba_{1-x}Ca_x)_a(Ti_{1-y}Zr_y)O_3$ (1), where $0.09 \leq x \leq 0.30$, $0.025 \leq y \leq 0.085$ and $0.986 \leq a \leq 1.020$;

$(Ba_{1-v}Ca_v)_b(Ti_{1-w}Zr_w)_cO_d$ (2), where $0 \leq v \leq 1$, $0 \leq w \leq 1$, $1 \leq b \leq 6$, $2 \leq c \leq 19$, $b+2c-1 \leq d \leq b+2c$ and $b<c$;

$(Ba_{1-m}Ca_m)_e(Ti_{1-n}Zr_n)_fO_g$ (4), where $0 \leq m \leq 1$, $0 \leq n \leq 1$, $2 \leq e \leq 5$, $1 \leq f \leq 3$, $g=e+2f$ and $e>f$.

2. The piezoelectric ceramic according to claim 1, wherein Bi content is 0.042 weight parts to 0.850 weight parts relative to 100 weight parts of the metal oxide in terms of metal.

3. The piezoelectric ceramic according to claim 1, wherein a ratio A1/B1, where A1 is a number of moles of Ba and Ca and B1 is a number of moles of Ti and Zr of the first crystal grains that contact the second crystal grains, and a ratio A2/B2, where A2 is a number of moles of Ba and Ca and B2 is a number of moles of Ti and Zr of the first crystal grains that do not contact the second crystal grains, are such that A1/B1>A2/B2.

4. The piezoelectric ceramic according to claim 1, wherein
the metal oxide expressed by the general formula (2) is at least a metal oxide selected from $BaTi_2O_5$, $BaTi_4O_9$, $BaTi_5O_{11}$, $BaTi_6O_{13}$, $BaTi_7O_{14}$, $BaTi_8O_{16}$, $Ba_2Ti_5O_{12}$, $Ba_2Ti_6O_{13}$, $Ba_2Ti_9O_{20}$, $Ba_4Ti_{11}O_{26}$, $Ba_4Ti_{13}O_{30}$, $CaTi_2O_4$, $CaTi_2O_5$, $CaTi_4O_9$, $Ca_2Ti_5O_{12}$, $CaZr_4O_9$, $Ca_2Zr_7O_{16}$, $Ca_6Zr_{19}O_{44}$, $CaZrTi_2O_7$ and $Ca_2Zr_5Ti_2O_{16}$.

5. The piezoelectric ceramic according to claim 1, wherein a ratio A3/B3, where A3 is a number of moles of Ba and Ca and B3 is a number of moles of Ti and Zr of the first crystal grains that contact the second crystal grains, and a ratio A4/B4, where A4 is a number of moles of Ba and Ca and B4 is a number of moles of Ti and Zr of the first crystal grains that do not contact the second crystal grains, such that A3/B3<A4/B4.

6. The piezoelectric ceramic according to claim 1, wherein the metal oxide expressed by the general formula (4) is at least a metal oxide selected from $Ba_2TiO_4$, $Ca_2TiO_4$, $Ca_3Ti_2O_7$, $Ba_2ZrO_4$, $Ba_3Zr_2O_7$, $BaCaTiO_4$, $Ba_3Ca_2Ti_2O_9$ and $Ca_4Ti_3O_{10}$.

7. The piezoelectric ceramic according to claim 1, wherein, when a surface or a cross section of the piezoelectric ceramic is observed, the second crystal grains occupy an area at a ratio of 0.05% to 1.00% relative to a total area of the surface or the cross section.

8. The piezoelectric ceramic according to claim 1, wherein the first crystal grains have an average circle equivalent diameter of 500 nm to 10 μm.

9. The piezoelectric ceramic according to claim 1, wherein the piezoelectric ceramic has a relative density of 93% to 100%.

10. A piezoelectric element comprising a piezoelectric ceramic section containing the piezoelectric ceramic according to claim 1.

11. The piezoelectric element according to claim 10, wherein a plurality of piezoelectric ceramic sections and a plurality of electrode layers are alternately laid on one another.

12. The piezoelectric element according to claim 11, wherein the plurality of electrode layers are embedded in the plurality of piezoelectric ceramic layers and include electrodes that contain Ag and Pd, wherein an Ag content by weight M1 and a Pd content by weight M2 are at a weight ratio M1/M2 of $0.25 \leq M1/M2 \leq 4.0$.

13. The piezoelectric element according to claim 11, wherein the plurality of electrode layers are embedded in the plurality of piezoelectric ceramic layers and include electrodes that contain Ni or Cu.

14. A liquid ejection head comprising:
a liquid chamber having a vibrating section provided with the piezoelectric element according to claim 10; and
an ejection port communicating with the liquid chamber.

15. A liquid ejection device comprising:
a mounting section for supporting a transfer medium; and
the liquid ejection head according to claim 14,
the liquid ejection device being so configured as to cause liquid ejected from the liquid ejection head to adhere to the transfer medium supported on the mounting section.

16. An ultrasonic motor comprising:
a vibrator provided with the piezoelectric element according to claim 10; and
a mobile body held in contact with the vibrator,
the mobile body being so arranged as to be driven to move by vibrations of the vibrator.

17. An optical instrument comprising:
a drive section having the ultrasonic motor according to claim 16.

18. A vibration device comprising:
a vibrator formed of a vibrating plate provided with the piezoelectric element according to claim 10.

19. A dust removal device comprising:
a vibrating section having the vibration device according to claim 18.

20. An image pickup device comprising:
an image pickup element unit; and
the dust removal device according to claim 19;
a vibrating section of the dust removal device being arranged at a light receiving surface side of the image pickup element unit.

21. A piezoelectric acoustic unit comprising the piezoelectric element according to claim 10.

22. A method of manufacturing the piezoelectric ceramic according to claim 1, the method comprising, in stated order:
a step of obtaining a powdery mixture by mixing a first powder of a metal oxide containing Ba, Ca, Ti and Zr and having a perovskite structure and a second powder of a metal oxide containing Ba and Ti and having a crystal structure different from the first powder at a mixing ratio of 95 mass % to 99.9 mass % for a part of the first powder;
a granulating step;
a molding step; and
a sintering step conducted at a temperature not higher than 1,380° C.

23. The piezoelectric ceramic according to claim 1, wherein a compound constituting the first crystal grains and a compound constituting the second crystal grains can be identified by comparing a diffraction image obtained by selected area electron diffractometry using a transmission electron microscope.

24. An electronic instrument comprising the piezoelectric element according to claim 10.

25. A piezoelectric ceramic comprising Ba, Ca, Ti, Zr and Mn,
wherein a value of x, which is a molar ratio of Ca relative to a sum of Ba and Ca, is $0.09 \leq x \leq 0.30$, and a value of y, which is a molar ratio of Zr relative to a sum of Ti and Zr, is $0.025 \leq y \leq 0.085$, while a content of Mn relative to 100 weight parts of a perovskite type oxide containing Ba, Ca, Ti and Zr is from 0.04 weight parts to 0.36 weight parts,
wherein the piezoelectric ceramic has a plurality of first crystal grains having a perovskite structure and a plurality of second crystal grains having a crystal structure different from that of the first crystal grains, and
wherein the second crystal grains contain a metal oxide expressed by a general formula (2) or a general formula (4):

$$(Ba_{1-v}Ca_v)_b(Ti_{1-w}Zr_w)_cO_d \quad (2),$$

where a value of v, which is a molar ratio of Ca relative to a sum of Ba and Ca is $0 \leq v \leq 1$, and a value of w, which is a molar ratio of Zr relative to a sum of Ti and Zr is $0 \leq w \leq 1$, while $1 \leq b \leq 6$, $2 \leq c \leq 19$, $b+2c-1 \leq d \leq b+2c$ and $b \ll c$;

$$(Ba_{1-m}Ca_m)_e(Ti_{1-n}Zr_n)_fO_g \quad (4),$$

where a value of m, which is a molar ratio of Ca relative to a sum of Ba and Ca is $0 \leq m \leq 1$, and a value of n, which is a molar ratio of Zr relative to a sum of Ti and Zr is $0 \leq n \leq 1$, while $2 \leq e \leq 5$, $1 \leq f \leq 3$, $g = e+2f$ and $e > f$.

26. The piezoelectric ceramic according to claim 25, wherein a compound constituting the first crystal grains and a compound constituting the second crystal grains can be identified by comparing a diffraction image obtained by selected area electron diffractometry using a transmission electron microscope.

27. A piezoelectric element comprising a piezoelectric ceramic section containing the piezoelectric ceramic according to claim 25 and electrodes.

28. An electronic instrument comprising the piezoelectric element according to claim 27.

* * * * *